(12) United States Patent
Ahn et al.

(10) Patent No.: US 11,259,419 B2
(45) Date of Patent: Feb. 22, 2022

(54) DISPLAY DEVICE AND METHOD OF FABRICATING THE SAME

(71) Applicant: Samsung Display Co., Ltd., Yongin-Si (KR)

(72) Inventors: Seongsik Ahn, Yongin-si (KR); Kijong Kim, Cheonan-si (KR); Minki Kim, Hwaseong-si (KR); Seunghwan Baek, Seoul (KR); In-su Baek, Seoul (KR); Gyunsoo Kim, Daejeon (KR)

(73) Assignee: Samsung Display Co., Ltd.

( * ) Notice: Subject to any disclaimer, the term of this patent is extended or adjusted under 35 U.S.C. 154(b) by 141 days.

(21) Appl. No.: 16/730,937

(22) Filed: Dec. 30, 2019

(65) Prior Publication Data
US 2020/0137903 A1   Apr. 30, 2020

Related U.S. Application Data

(62) Division of application No. 15/917,289, filed on Mar. 9, 2018, now Pat. No. 10,555,426.

(30) Foreign Application Priority Data

Jul. 7, 2017   (KR) .................. 10-2017-0086701

(51) Int. Cl.
*H05K 1/18*   (2006.01)
*H05K 5/00*   (2006.01)
(Continued)

(52) U.S. Cl.
CPC ......... *H05K 5/0017* (2013.01); *G06F 1/1626* (2013.01); *G06F 1/1637* (2013.01);
(Continued)

(58) Field of Classification Search
CPC ........ H05K 5/0017; H05K 1/144; H05K 3/46; H05K 5/03; H05K 1/0277; H05K 1/028;
(Continued)

(56) References Cited

U.S. PATENT DOCUMENTS 6,870,590 B2 *  3/2005  Shoji ............... H05K 1/147
                                              349/152
9,285,835 B2    3/2016  Lee et al.
(Continued)

FOREIGN PATENT DOCUMENTS

CN     1338880 A    3/2002
CN   104021734 A    9/2014
(Continued)

OTHER PUBLICATIONS

Chinese Communication corresponding to Chinese Patent Application No. 201810736584.7 dated Jun. 21, 2021 12 pages.

*Primary Examiner* — Binh B Tran
(74) *Attorney, Agent, or Firm* — Innovation Counsel LLP

(57) ABSTRACT

A display device includes a display panel, a first circuit board, a second circuit board, a first adhesive element, and a conductive element. The display panel includes a non-bending region and a bending region that is bent from the non-bending region. The bending region includes a curvature region having a specific curvature and a facing region facing the non-bending region in a thickness direction of the display module. The first adhesive element is disposed to combine the first circuit board with the second circuit board, and the conductive element is disposed to electrically connect the first circuit board to the second circuit board.

6 Claims, 27 Drawing Sheets

(51) Int. Cl.
*H05K 5/03* (2006.01)
*H05K 1/14* (2006.01)
*H05K 3/46* (2006.01)
*H04M 1/02* (2006.01)
*G06F 1/16* (2006.01)
*G06F 3/041* (2006.01)
*H05K 1/02* (2006.01)
*H05K 1/11* (2006.01)
*H05K 3/36* (2006.01)

(52) U.S. Cl.
CPC ........... *H04M 1/02* (2013.01); *H04M 1/0268* (2013.01); *H04M 1/0277* (2013.01); *H05K 1/144* (2013.01); *H05K 3/46* (2013.01); *H05K 5/03* (2013.01); *G06F 1/1616* (2013.01); *G06F 1/1643* (2013.01); *G06F 3/041* (2013.01); *H05K 1/028* (2013.01); *H05K 1/0277* (2013.01); *H05K 1/118* (2013.01); *H05K 1/147* (2013.01); *H05K 3/363* (2013.01); *H05K 2201/05* (2013.01); *H05K 2201/055* (2013.01); *H05K 2201/10128* (2013.01); *H05K 2203/085* (2013.01)

(58) Field of Classification Search
CPC ........ H05K 1/118; H05K 1/147; H05K 3/363; H05K 2201/05; H05K 2201/055; H05K 2201/10128; H05K 2203/085; G06F 1/1626; G06F 1/1637; G06F 1/1616; G06F 1/1643; G06F 3/041; H04M 1/02; H04M 1/0268; H04M 1/0277
USPC ........................................................ 361/749
See application file for complete search history.

(56) References Cited

U.S. PATENT DOCUMENTS

| | | | |
|---|---|---|---|
| 9,671,546 | B2 | 7/2017 | Baek et al. |
| 9,769,919 | B2 | 9/2017 | Park et al. |
| 9,798,414 | B2 | 10/2017 | Kim et al. |
| 9,818,974 | B2 | 11/2017 | Kwon et al. |
| 10,048,786 | B2 | 8/2018 | Ahn et al. |
| 10,080,281 | B2 | 9/2018 | Jung et al. |
| 2013/0249860 | A1 | 11/2013 | Seo et al. |
| 2015/0200375 | A1 | 7/2015 | Kim et al. |
| 2015/0253613 | A1* | 9/2015 | Yoon ................... G02F 1/13452 349/58 |
| 2016/0172623 | A1* | 6/2016 | Lee ..................... H01L 51/5253 257/40 |
| 2016/0210894 | A1* | 7/2016 | Lee ................... G02F 1/133305 |
| 2016/0266690 | A1 | 9/2016 | Ahn et al. |

FOREIGN PATENT DOCUMENTS

| | | |
|---|---|---|
| CN | 104819402 A | 8/2015 |
| CN | 104869749 A | 8/2015 |
| CN | 105825773 A | 8/2016 |
| CN | 105938405 A | 9/2016 |
| CN | 105976701 A | 9/2016 |
| KR | 10-2002-0013736 A | 2/2002 |
| KR | 10-2013-0107640 A | 10/2013 |
| KR | 10-2014-0075211 A | 6/2014 |
| KR | 10-2015-0014713 A | 2/2015 |
| KR | 10-2015-0084257 A | 7/2015 |
| KR | 10-2016-0092123 A | 8/2016 |
| KR | 10-2017-0071986 A | 6/2017 |

\* cited by examiner

DISPLAY DEVICE AND METHOD OF FABRICATING THE SAME

CROSS-REFERENCE TO RELATED APPLICATIONS

This application is a divisional application of U.S. patent application Ser. No. 15/917,289, filed on Mar. 9, 2018, which claims priority to and benefits from Korean Patent Application No. 10-2017-0086701, filed on Jul. 7, 2017, in the Korean Intellectual Property Office under 35 U.S.C. § 119, the disclosures of which are hereby incorporated by reference in their entirety.

BACKGROUND OF THE INVENTION

The present disclosure relates to a display device and a method of fabricating the same, and in particular, to a display device with a reduced failure rate and a method of fabricating the same.

Electronic devices, such as smart phones, tablets, notebook computers, and smart television sets, are being developed. These electronic devices typically include a display device that is used to provide information to a user. The electronic devices may further include various electronic modules, in addition to the display device.

An electronic device including a display device and electronic modules is fabricated by assembling the display device and the electronic modules. For example, the electronic device includes an external case and a bracket that are used to organizationally arrange the electronic modules.

A portion of the display device of the electronic device may have a bent portion, rendering it difficult or even possible to realize a slim bezel. A process error in a process of bending the display device may lead to a failure of the display device or the electronic device as a whole.

SUMMARY

Some embodiments of the inventive concept provide a display device configured to reduce a failure rate that may be caused by a bending process.

Some embodiments of the inventive concept a method of fabricating a display device with a low failure rate.

According to some embodiments of the inventive concept, a display device may include a window member and a display module disposed on a rear surface of the window member. The display module may include a display panel, a first circuit board, a second circuit board, a first adhesive element, and a conductive element.

In some embodiments, the display panel may include a non-bending region and a bending region that is bent from the non-bending region, and the bending region may include a curvature region having a specific curvature and a facing region facing the non-bending region in a thickness direction of the display module. The first circuit board may be disposed on a rear surface of the display panel, and the second circuit board may be disposed to electrically connect the display panel to the first circuit board. The first adhesive element may be disposed between the first circuit board and the second circuit board in the thickness direction of the display module to combine the first circuit board with the second circuit board, and the conductive element may be disposed between the first circuit board and the second circuit board in the thickness direction of the display module to electrically connect the first circuit board to the second circuit board.

In some embodiments, the display panel may have a plurality of first adhesion regions that is disposed with the first adhesive element on the rear surface of the display panel.

In some embodiments, the plurality of first adhesion regions may include a left region and a right region that are disposed to be spaced apart with respect to a first reference line, wherein the first reference line may be perpendicular to a bending axis of the bending region and bisect the second circuit board. The left region and the right region may be symmetric with respect to the first reference line and may be configured to exert substantially the same stress during a process of bending the bending region.

In some embodiments, the left region and the right region may have the same area and shape.

In some embodiments, the left region and the right region may have the same area and different shapes and may be disposed to have respective centers that are symmetrically positioned with respect to the first reference line.

In some embodiments, the plurality of first adhesion regions may include n left regions and m right regions that are disposed to be spaced apart from a first reference line, where n and m are natural numbers equal to or larger than 1.

In some embodiments, a center of the n left regions and a center of the m rights regions may be symmetrically positioned with respect to the first reference line.

In some embodiments, the display device may further include an underlying element disposed on the rear surface of the display panel and a second adhesive element combining the underlying element with the first circuit board. The underlying element may include a force sensing unit.

In some embodiments, the display panel may have a plurality of second adhesion regions that is disposed with the second adhesive element on the rear surface of the display panel. The second adhesion regions may be disposed to be symmetric with respect to a first reference line that is perpendicular to a bending axis of the bending region and bisects the second circuit board.

In some embodiments, the first circuit board may include a first region and a second region divided by a second reference line that is parallel to a bending axis of the bending region, and the second reference line may bisect a length of the first circuit board measured on a first reference line that is perpendicular to the bending axis and bisects the second circuit board. The bending region may be closer to the first region than to the second region, and the conductive element may be overlapped with the second region.

In some embodiments, the conductive element may include an anisotropic conductive film (ACF). The display device may further include a driving chip mounted on the second circuit board.

In some embodiments, the second circuit board may include a first surface and a second surface facing each other, and the first surface may be in contact with the conductive element. The display device may further include a third adhesive element combining the second surface and an underlying element, and the underlying element may be disposed between the display panel and the second surface of the second circuit board.

In some embodiments, the second circuit board may include a first surface and a second surface facing each other, and the first surface may be in contact with the conductive element. The driving chip may be mounted on the first surface of the second circuit board, the first circuit board may include a cut region in the first region, and the driving chip may be placed in the cut region of the first circuit board.

In some embodiments, the display module may further include an input sensing unit disposed between the window member and the display panel and a support panel disposed on the rear surface of the display panel.

In some embodiments, the display panel may include a base layer disposed to correspond to the non-bending region and the bending region, a circuit layer disposed on a front surface of the base layer to correspond to the non-bending region and the bending region, a device layer disposed on a front surface of the circuit layer and overlapped with the non-bending region, and an encapsulation layer disposed on the device layer.

In some embodiments, the display device may further include a protection film disposed on a rear surface of the base layer. The protection film may include a first protection film corresponding to the non-bending region and a second protection film disposed to correspond to the facing region and spaced apart from the first protection film with the curvature region interposed therebetween.

In some embodiments, the display device may further include a stress control film disposed on a front surface of the display panel. 70% or more of a total area of the stress control film is positioned in the curvature region.

According to some embodiments of the inventive concept, a display device may include a window member, a display panel disposed on a rear surface of the window member, the display panel including a non-bending region and a bending region that is bent from the non-bending region, a first circuit board disposed on a rear surface of the display panel having a cut region, a second circuit board electrically connecting the bending region of the display panel to the first circuit board, a driving chip mounted on the second circuit board and placed in the cut region, and an adhesive element disposed between the first circuit board and the second circuit board in a thickness direction of the display panel to combine the first circuit board with the second circuit board.

According to some embodiments of the inventive concept, a method of fabricating a display device include providing a display device and bending a second region of a display panel to place a flexible circuit board and a driving circuit board to face a rear surface of the display panel.

In some embodiments, the display device may include a window member, a display panel including a first region combined with the window member and a second region uncombined with the window member, a flexible circuit board combined with the second region of the display panel, a driving circuit board combined with the flexible circuit board, a first adhesive element that is disposed between the flexible circuit board and the driving circuit board in a thickness direction of the display panel to combine the flexible circuit board with the driving circuit board, and a conductive element that is disposed between the flexible circuit board and the driving circuit board in the thickness direction of the display panel to electrically connect the first circuit board to the second circuit board. The conductive element may be disposed farther away from the display panel than the first adhesive element.

In some embodiments, the bending of the second region of the display panel may include attaching a supplementary film to the driving circuit board, suctioning the supplementary film using a vacuum suction device and moving the vacuum suction device to bend the second region at a specific curvature.

In some embodiments, the method may further include attaching adhesive elements to a rear surface of an underlying element that is disposed on the rear surface of the display panel prior to bending the second region of the display panel.

In some embodiments, at least one of the adhesive elements may be used to combine the underlying element with the driving circuit board. At least one other of the adhesive elements may be used to combine the underlying element with the flexible circuit board.

In some embodiments, the second region of the display panel may include a curvature region and a facing region, the bending of the second region of the display panel may be performed to bend the curvature region at a specific curvature and to place the facing region to face the first region in a thickness direction of the display panel, and at least one of the adhesive elements may be used to combine the underlying element with the facing region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
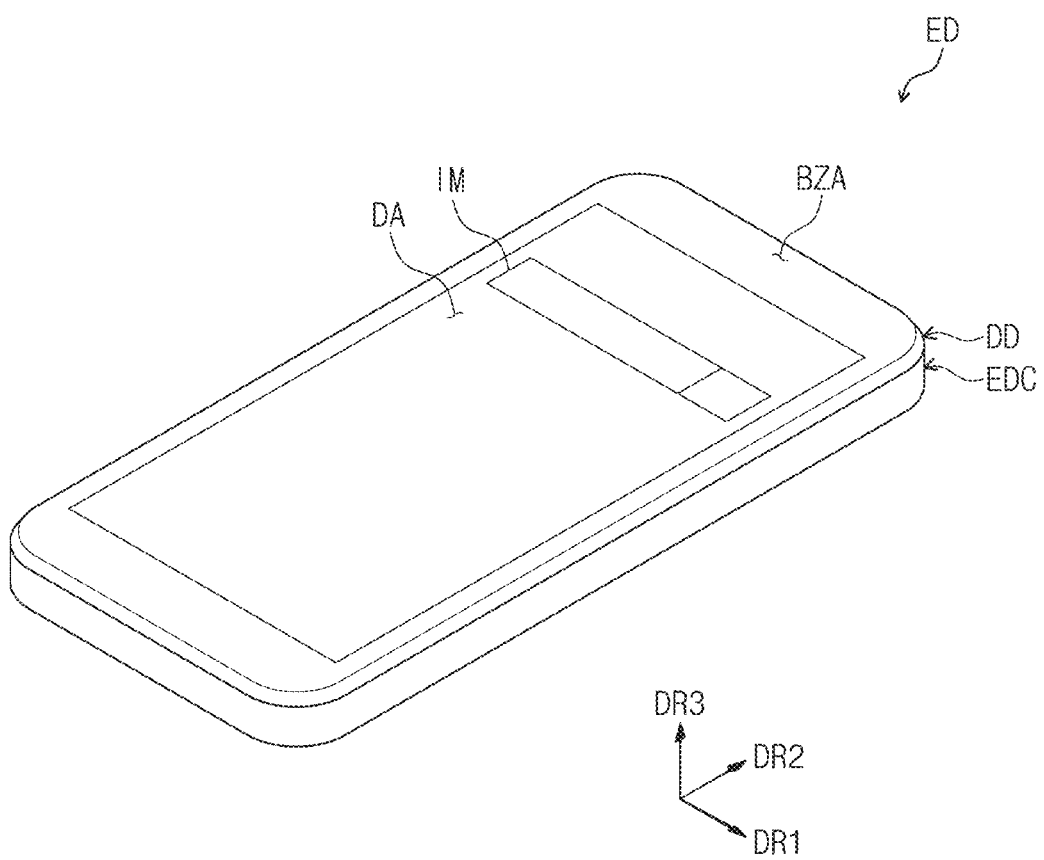
FIG. 1A is a perspective view of an electronic device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions, and/or structural elements may be reduced or exaggerated for clarity. The use of similar or identical reference numbers in the various drawings is intended to indicate the presence of a similar or identical element or feature.

DETAILED DESCRIPTION

Example embodiments of the present inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that the present disclosure will be thorough and complete, and will fully convey the concept of example embodiments to those of ordinary skill in the art. In the drawings, the thicknesses of layers and regions may be exaggerated for clarity. Like reference numerals in the drawings denote like elements, and thus their description may be omitted.

It will be understood that when an element is referred to as being "connected" or "coupled" to another element, it can be directly connected or coupled to the connected or coupled element or one or more intervening elements may be present. In contrast, when an element is referred to as being "directly connected" or "directly coupled" to another element, there may be no intervening elements present. Like numbers indicate like elements throughout. As used herein the term "and/or" includes any and all combinations of one or more of the associated listed items. Other terms or phrases used to describe the relationship between elements or layers should be interpreted in a like fashion (e.g., "between" versus "directly between," "adjacent" versus "directly adjacent," and "on" versus "directly on").

It will be understood that, although the terms "first", "second", etc. may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises", "comprising", "includes," and/or "including," if used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments of the present disclosure belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
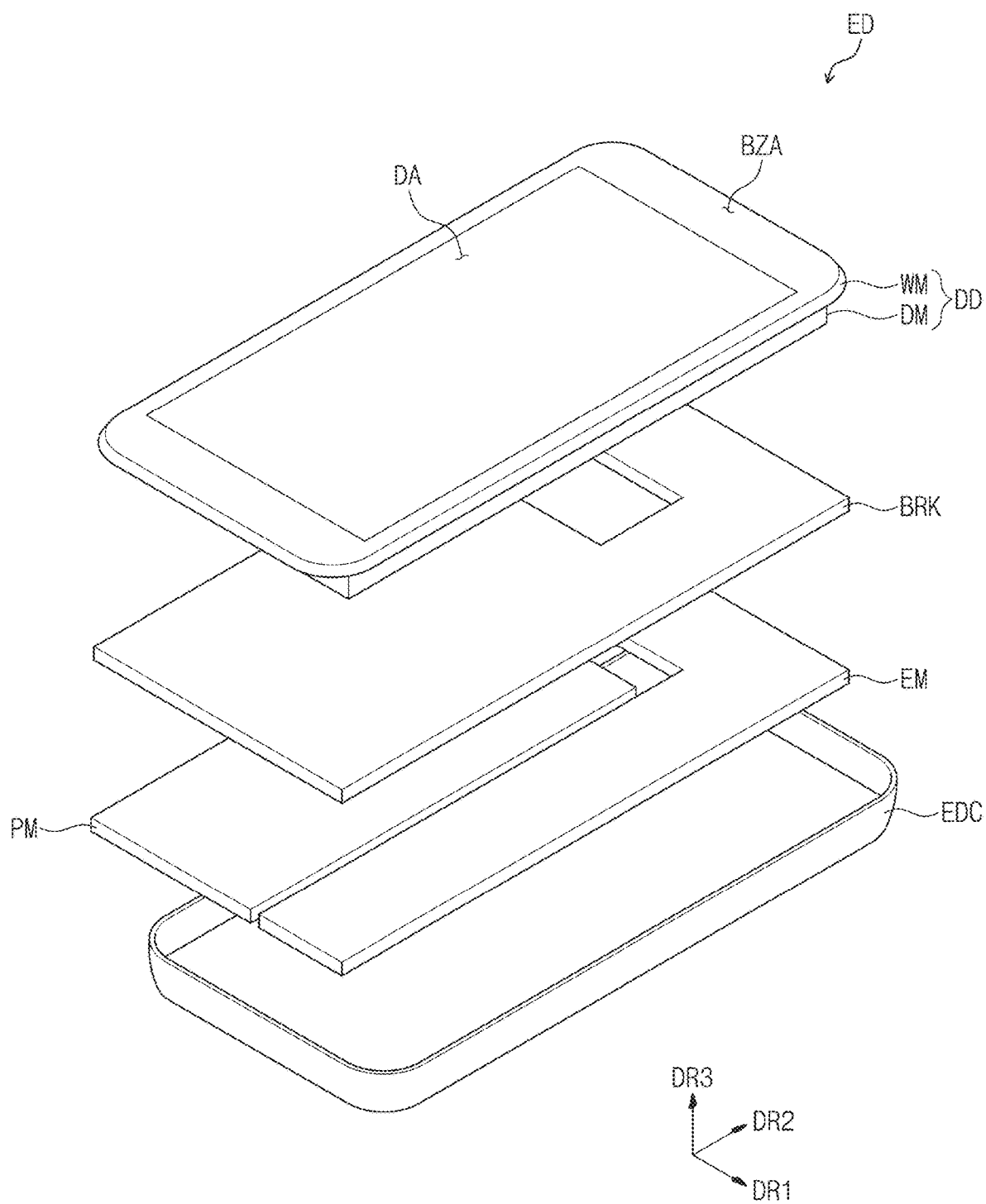
FIG. 1B is an exploded perspective view of an electronic device according to some embodiments of the inventive concept.
Figure 2:
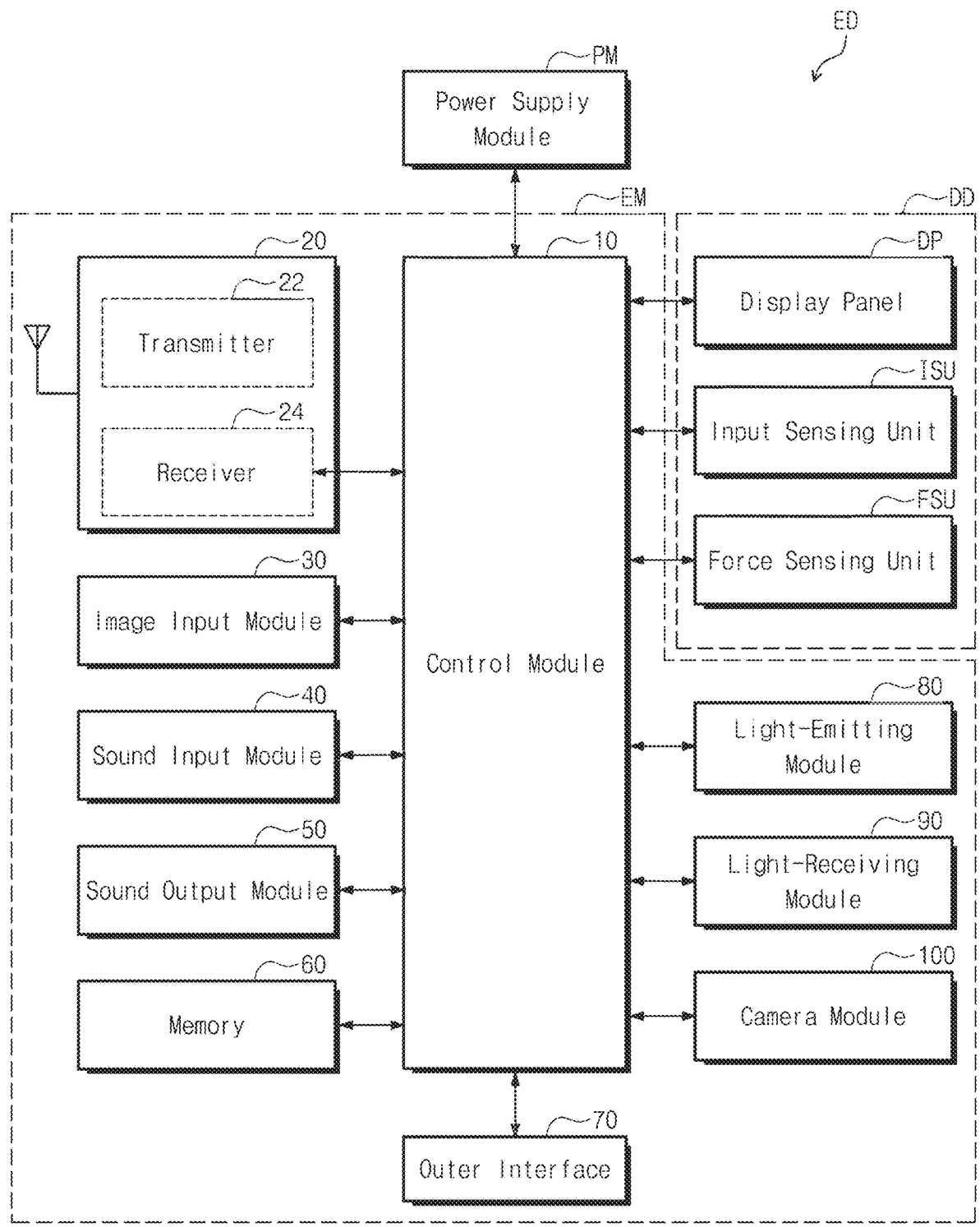
FIG. 2 is a block diagram of an electronic device according to some embodiments of the inventive concept.

FIG. 1A is a perspective view of an electronic device ED according to some embodiments of the inventive concept. FIG. 1B is an exploded perspective view of the electronic device ED according to some embodiments of the inventive concept. FIG. 2 is a block diagram of the electronic device ED according to some embodiments of the inventive concept.

In the present embodiment, a smart phone is illustrated as an example of the electronic device ED, but the inventive concept is not limited thereto. In some embodiments, the electronic device ED may be one of a tablet computer, a notebook computer, and a smart television set.

As shown in FIG. 1A, a display surface that is used to display an image IM may be parallel to a plane defined by a first direction axis DR1 and a second direction axis DR2. The display surface may include a display region DA and a bezel region BZA that is adjacent to the display region DA. FIG. 1A illustrates an internet search window as an example of the image IM. In some embodiments, the display region DA may have a rectangular shape. The bezel region BZA may be disposed to enclose the display region DA. In other words, the bezel region BZA may serve as a border of the display surface. In certain embodiments, the bezel region BZA may be provided at only two regions facing each other in the first direction axis DR1 or the second direction axis DR2.

Hereinafter, a third direction axis DR3 will be used to refer to a normal direction of the display surface (i.e., a thickness direction of the electronic device ED). A front, top, or first surface of each member may be distinguished from a rear, bottom, or second surface thereof, based on a display direction of the image IM. However, directions indicated by the first to third direction axes DR1, DR2, and DR3 may be relative concepts, and in certain embodiments, they may be changed to indicate other directions. Hereinafter, first to third directions may be directions indicated by the first to third direction axes DR1, DR2, and DR3, respectively, and will be identified with the same reference numbers.

As shown in FIGS. 1A and 1B, the electronic device ED may include a display device DD, an electronic module EM, a power supply module PM, a bracket BRK, and an external case EDC. In FIGS. 1A and 1B, the components of the electronic device ED are illustrated in a simplified manner.

The display device DD may include a window member WM and a display module DM. The window member WM may serve as a front surface of the electronic device ED. The display module DM may be disposed on a rear surface of the window member WM and may be used to display an image. In addition, the display module DM may be configured to sense a user input (e.g., a touch event and/or pressure from a user). The display module DM may be electrically connected to the electronic module EM through a flexible circuit board or an electric connector.

In the present embodiment, the display module DM is illustrated to provide a flat display surface, but the display module DM may have various other shapes. The display module DM may be provided to have curved edges that face each other in the first direction DR1 and are bent from a center portion of the display module DM.

The power supply module PM may be configured to supply an electric power to the electronic device ED. The power supply module PM may include a battery module.

The bracket BRK may be combined with the display device DD and/or the external case EDC to divide an internal space of the electronic device ED into at least two portions. The bracket BRK may provide a space for containing other components. In addition, the bracket BRK may be configured to fixedly support the display device DD. The bracket BRK may have one or more connection holes that are formed to have a shape corresponding to that of the electronic module EM and thereby to allow the electronic module EM to be fastened to the bracket BRK. The bracket BRK may include a metallic or plastic part. Although the electronic device ED is illustrated to have just one bracket BRK, the electronic device ED may be configured to include a plurality of brackets BRK.

The external case EDC may be combined with the bracket BRK and/or the display device DD. The external case EDC may define an outer appearance of the electronic device ED. Although the external case EDC is illustrated as a single body, the external case EDC may include a plurality of bodies that are assembled with each other. The external case EDC may include a plurality of frames and/or plates, each of which is formed of at least one of glass, plastic, and metallic materials.

The electronic module EM may include a motherboard and various functional modules that are mounted on the motherboard and are used to operate the electronic device ED. The motherboard may be electrically connected to the display device DD through an electric connector and so forth. Here, the motherboard may include a rigid circuit board.

As shown in FIG. 2, the electronic module EM may include a control module 10, a wireless communication module 20, an image input module 30, a sound input module 40, a sound output module 50, a memory 60, an outer interface 70, a light-emitting module 80, a light-receiving module 90, and a camera module 100. Some of the modules may not be mounted on the motherboard and may be electrically connected to the motherboard through a flexible circuit board or an electric connector.

The control module 10 may be configured to control overall operations of the electronic device ED. The control module 10 may be, for example, a microprocessor. In some embodiments, the display device DD may be activated or inactivated under the control of the control module 10. For example, the control module 10 may control the image input module 30, the sound input module 40, and the sound output module 50, based on a user input signal received from the display device DD.

The wireless communication module 20 may be configured to transmit and receive a wireless signal to and from another device or module via a Bluetooth or a Wi-Fi line. The wireless communication module 20 may be configured to transmit and receive a voice signal via a communication line. The wireless communication module 20 may include a transmitter 22 that is configured to modulate and transmit a signal to be transmitted, and a receiver 24 that is configured to demodulate the received signal.

The image input module 30 may be configured to process an image signal and convert the processed image signal into image data that can be displayed on the display device DD. The sound input module 40 may be configured to receive an external sound signal that is obtained by a microphone in a recording mode, a voice recognition mode, and so forth, and then to convert the sound signal into electrical voice data. The sound output module 50 may be configured to convert sound data that is transmitted from the wireless communication module 20 or is stored in the memory 60, and to output the converted sound data to the outside of the electronic device ED.

The outer interface 70 may be configured to serve as an interface that is connected to an external charger, a wired/wireless data port, a card socket (e.g., a memory card or a SIM/UIM card), and so forth.

The light-emitting module 80 may be configured to generate and output light. In certain embodiments, the light-emitting module 80 may be configured to emit infrared light. The light-emitting module 80 may include a light-emitting diode (LED) device. The light-receiving module 90 may be configured to sense infrared light. The light-receiving module 90 may be configured to be activated, when the infrared light incident thereto has an intensity higher than a threshold value. The light-receiving module 90 may be a complementary metal-oxide semiconductor (CMOS) image sensor. The infrared light emitted from the light-emitting module 80 may be reflected by an external object (e.g., a user's finger or face) and may be received by the light-receiving module 90. More optical components constituting each of the light-emitting module 80 and the light-receiving module 90 may be added, if necessary. The camera module 100 may be used to obtain an image of an external object. According to usage purpose or a configuration, one or more camera modules 100 may be arranged in the electronic device ED.

Figure 3A:
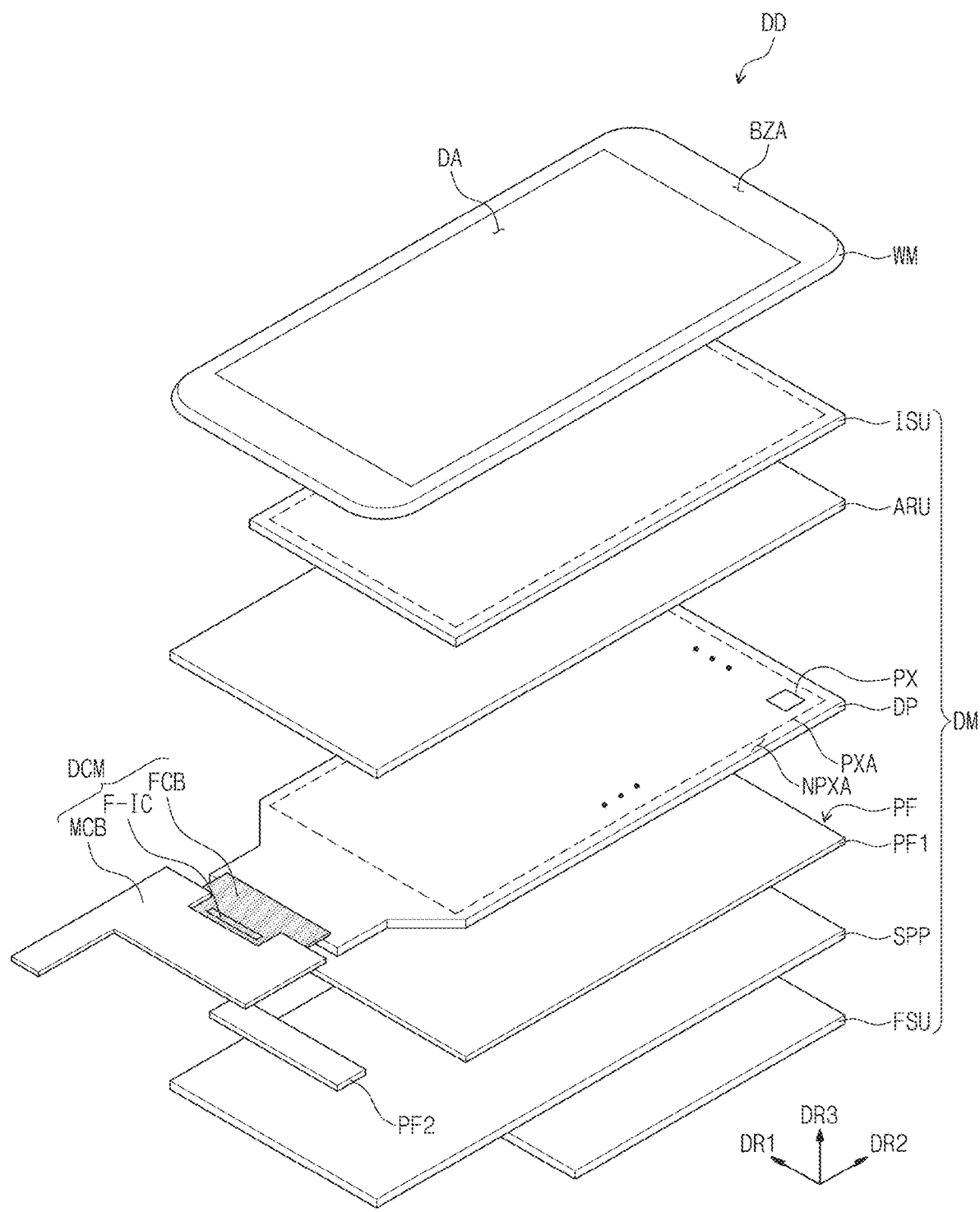
FIG. 3A is an exploded perspective view of a display device according to some embodiments of the inventive concept.
Figure 3B:
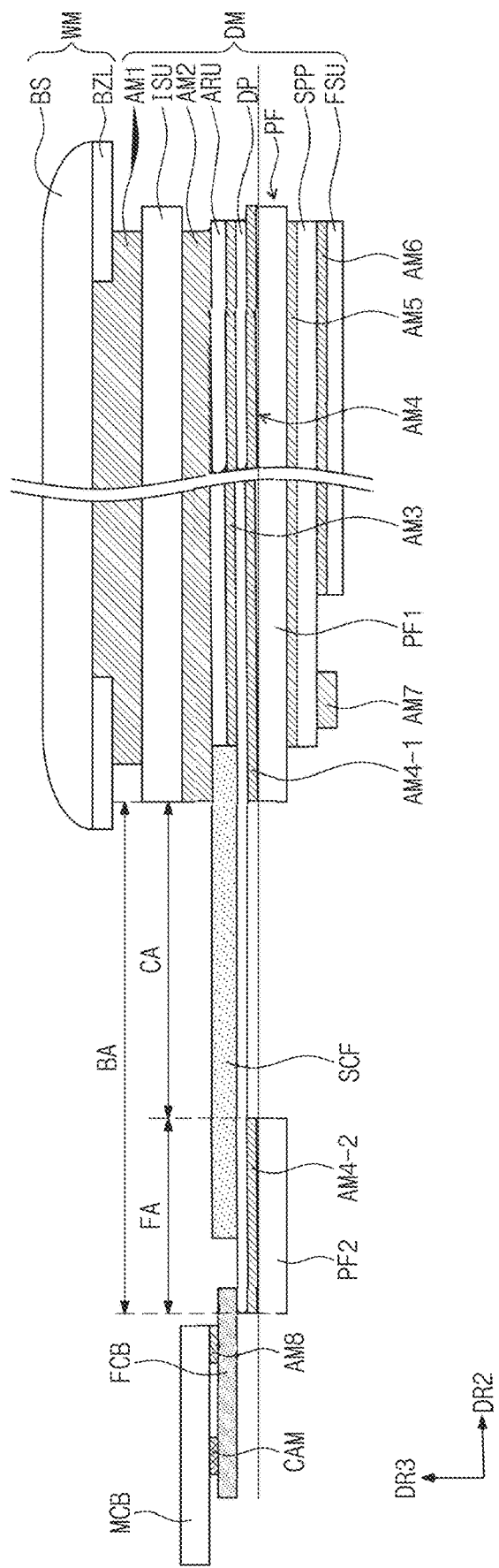
FIG. 3B is a first side view of a display device according to some embodiments of the inventive concept.
Figure 3C:
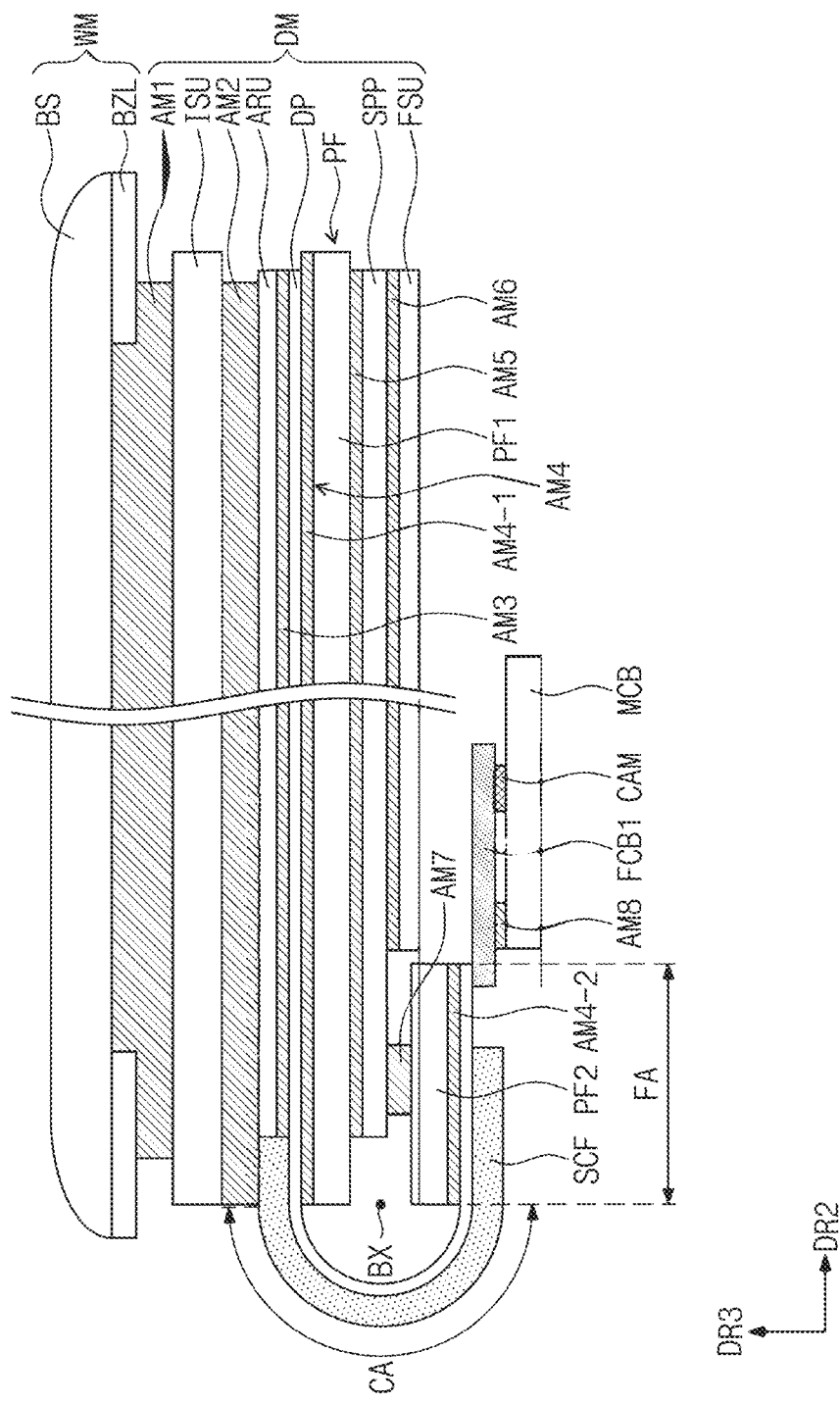
FIG. 3C is a second side view of a display device according to some embodiments of the inventive concept.
Figure 3D:
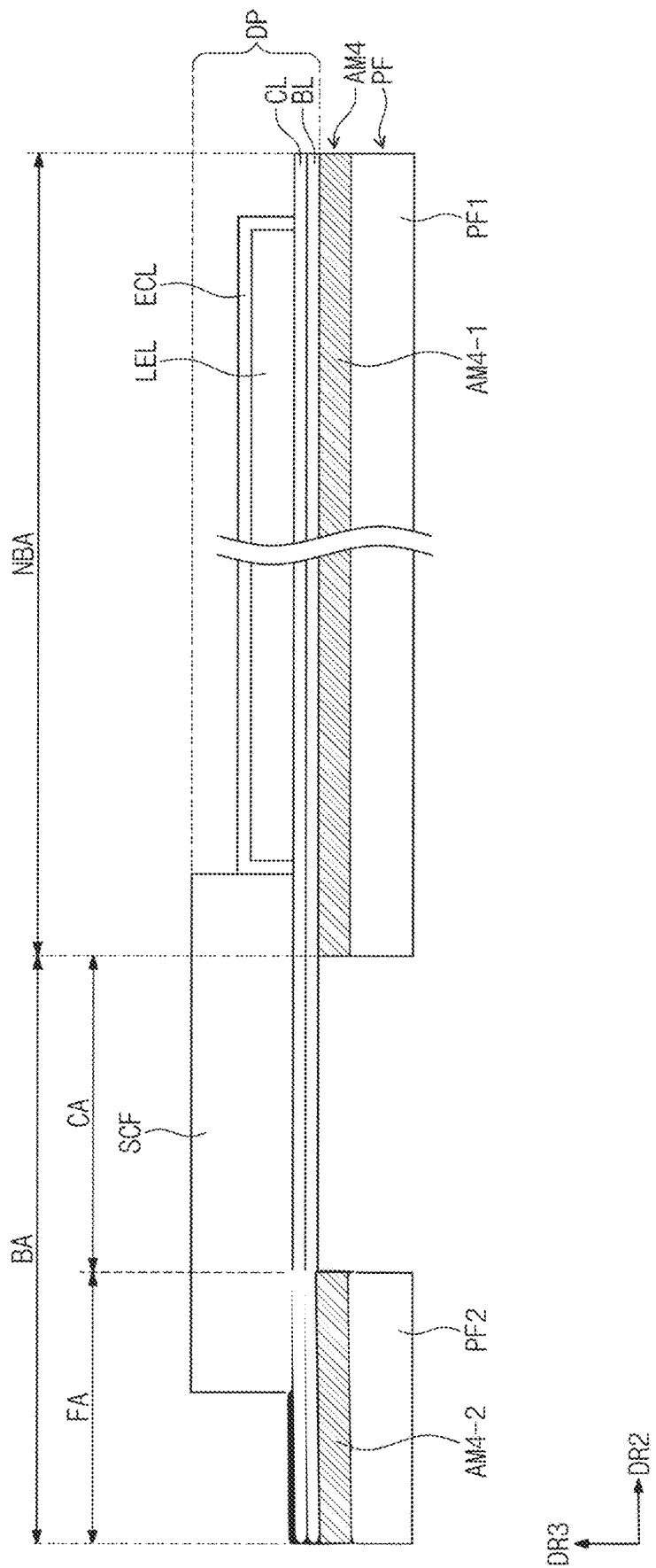
FIG. 3D is a sectional view of a display panel according to some embodiments of the inventive concept.

FIG. 3A is an exploded perspective view of the display device DD according to some embodiments of the inventive concept. FIG. 3B is a first side view of the display device DD according to some embodiments of the inventive concept. FIG. 3C is a second side view of the display device DD according to some embodiments of the inventive concept. FIG. 3D is a sectional view of a display panel DP according to some embodiments of the inventive concept. It is noted that adhesive elements are not shown in FIG. 3A.

As shown in FIGS. 3A to 3C, the display device DD may include the window member WM and the display module DM. The window member WM may include a base structure BS and a bezel layer BZL that is disposed on a rear surface of the base structure BS. A region provided with the bezel layer BZL may be defined as the bezel region BZA of FIGS. 1A and 1B. Although, in the present embodiment, the window member WM is illustrated to have a flat shape in the display region DA, the window member WM may have various other shapes. For example, the window member WM may have curved edges that face each other in the first direction DR1.

The base structure BS may include a glass substrate, a sapphire substrate, a plastic substrate, and so forth. The base structure BS may have a single- or multi-layered structure. For example, the base structure BS may include a plurality of plastic films that are combined to each other by an adhesive element. The base structure BS may include a glass substrate and a plastic film that is combined to the glass substrate by the adhesive element.

The bezel layer BZL may have a single- or multi-layered structure. As an example of the multi-layered structure, the bezel layer BZL may include a buffer layer having a good adhesive property, a patterned layer displaying a specific pattern, and an achromatic layer. The patterned layer may be configured to display a pattern referred to as a hairline. The achromatic layer may include a black pigment or a dye-containing organic mixture. Each of the layers may be formed by a deposition, printing, or coating process, or a combination of two or more processes. Although not shown, the window member WM may further include a functional coating layer that is disposed on a front surface of the base structure BS. The functional coating layer may include an anti-fingerprint layer, an anti-reflection layer, a hard coating layer, and so forth.

As shown in FIGS. 3A to 3C, the display module DM may include a display panel DP, an input sensing unit ISU, an anti-reflection unit ARU, a protection film PF, and a support panel SPP, a force sensing unit FSU, and a driving control module DCM. The display panel DP may be in an unfolded state as shown in FIG. 3B or in a bent state as shown in FIG. 3C.

The display panel DP may be a flexible display panel (e.g., an organic light emitting display panel). When viewed in a plan view, the display panel DP may include a pixel region PXA, in which a pixel PX is disposed, and a non-pixel region NPXA that is adjacent to the pixel region PXA. Peripheral components, such as signal lines and banks other than the pixels PX may be disposed in the non-pixel region NPXA. The pixel region PXA and the non-pixel region NPXA may respectively correspond to the display region DA and the bezel region BZA shown in FIG. 1A. However, the corresponding regions may not need to have the perfect sameness in terms of, for example, shape, area, and so forth.

The input sensing unit ISU may be configured to obtain information on coordinates of an external input. The input sensing unit ISU may be configured to sense various inputs that are provided from the outside of the electronic device ED. For example, the input sensing unit ISU may be configured to sense an input by a user's body or sense various external inputs, such as light, heat, or pressure. In addition, the input sensing unit ISU may be configured to sense an input being in contact with or close to a sensing surface of the electronic device ED.

The input sensing unit ISU may be, for example, a capacitive touch panel, an inductive touch panel, and so forth. The touch panel may include a base layer, touch sensors, and signal lines that are connected to touch sensors. The touch panel may include a region, in which the touch sensors are provided, and another region, in which the touch sensors are not provided, when viewed in a plan view. A region, on which the touch sensors are provided, may correspond to the pixel region PXA. Although not shown, the display device DD may further include a flexible circuit board that is coupled to the input sensing unit ISU.

The anti-reflection unit ARU may include a polarizing film and/or a phase retardation film. The number and the phase retardation length (e.g., $\lambda/4$ or $\lambda/2$) of the phase retardation film may be determined by a principle of the operation of the anti-reflection unit ARU. The anti-reflection unit ARU may include one or more color filters.

The protection film PF may be disposed on a rear surface of the display panel DP. In the present embodiment, the protection film PF may include a first protection film PF1 and a second protection film PF2 that are spaced apart from each other.

The protection film PF may include a plastic film serving as a base layer. The protection film PF may include a plastic film containing one selected from a group consisting of polyethersulfone (PES), polyacrylate (PA), polyetherimide (PEI), polyethylene naphthalate (PEN), polyethylene terephthalate (PET), polyphenylene sulfide (PPS), polyarylate, polyimide (PI), polycarbonate (PC), poly(arylene ether sulfone), and combination thereof.

Materials for the protection film PF are not limited to plastic resins, and organic/inorganic composites may be used for the protection film PF. The protection film PF may include a porous organic layer and an inorganic material that is formed to fill pores of the porous organic layer.

The support panel SPP may be disposed on a rear surface of the protection film PF to support the display panel DP and the protection film PF. The support panel SPP may be a metal plate having sufficiently high stiffness. The support panel SPP may be a stainless-steel plate. The support panel SPP may have a black color, and thus it may prevent an external light from being incident into the display panel DP.

The force sensing unit FSU may be disposed on a rear surface of the support panel SPP to sense an external pressure to be exerted on the display module DM. The force sensing unit FSU may include a base layer, piezo-electric devices, and signal lines that are connected to the piezo-electric devices.

The driving control module DCM may include a first circuit board MCB (or a driving circuit board), a second circuit board FCB connecting the first circuit board MCB to the display panel DP, and a driving chip F-IC that is mounted on the second circuit board FCB. Although not shown, a plurality of passive devices and a plurality of active devices may be mounted on the first circuit board MCB. The first circuit board MCB may be a rigid or flexible circuit board, and the second circuit board FCB may be a flexible circuit board.

Although not shown, the first circuit board MCB may be electrically connected to the motherboard of the electronic module EM of FIG. 1B through an electric connector.

Although the display module DM is illustrated to have both of the input sensing unit ISU and the anti-reflection unit ARU, at least one of the input sensing unit ISU and the anti-reflection unit ARU may be omitted from the display module DM. At least one of the input sensing unit ISU and the anti-reflection unit ARU may be integrated on the display panel DP, for example, by a successive process. Touch sensors serving as the input sensing unit ISU may be disposed on an encapsulation layer ECL shown in FIG. 3D, and color filters disposed on the encapsulation layer may be used as the anti-reflection unit ARU. In certain embodiments, the protection film PF may be omitted. Some parts of the driving control module DCM may be omitted. In certain embodiments, the driving chip F-IC may be mounted on the display panel DP instead of being mounted on the second circuit board FCB.

Hereinafter, the display module DM will be described in more detail with reference to FIGS. 3B to 3D. First to seventh adhesive elements AM1 to AM7 to be described below may be a pressure sensitive adhesive (PSA) film, an optically clear adhesive (OCA) film, or an optically clear resin (OCR) film. The first to seventh adhesive elements AM1 to AM7 may include a photo-curable adhesive material or a heat-curable adhesive material, but the inventive concept is not limited to the specific material thereof. In addition, at least one of the first to seventh adhesive elements AM1 to AM7 may be omitted.

The input sensing unit ISU may be disposed on the rear surface of the window member WM. The window member WM and the input sensing unit ISU may be combined to each other by the first adhesive element AM1. The anti-reflection unit ARU may be disposed on the rear surface of the input sensing unit ISU. The input sensing unit ISU and the anti-reflection unit ARU may be combined to each other by the second adhesive element AM2. The display panel DP may be disposed on the rear surface of the anti-reflection unit ARU. The anti-reflection unit ARU and the display panel DP may be combined to each other by the third adhesive element AM3. The third adhesive element AM3 may have a relatively small thickness compared with the first adhesive element AM1 and the second adhesive element AM2. Positions of the anti-reflection unit ARU and the input sensing unit ISU may be interchanged with each other.

For convenience in illustration, the display panel DP is illustrated to have a single-layered structure, in FIGS. 3B and 3C. As shown in FIG. 3D, the display panel DP may include a base layer BL, a circuit layer CL, a device layer LEL, and an encapsulation layer ECL.

The base layer BL may be a resin layer (e.g., of polyimide (PI)), but the inventive concept is not limited to a specific material. The circuit layer CL may be disposed on the front surface of the base layer BL. The circuit layer CL may have a multi-layered structure including an insulating layer, a conductive layer, and/or a semiconductor layer. The circuit layer CL may include a pixel circuit including a thin-film transistor and signal lines that are connected to the pixel circuit.

The device layer LEL may be disposed on a front surface of the circuit layer CL. The device layer LEL may include a light-emitting device (e.g., an organic light emitting device). The encapsulation layer ECL may be disposed on the device layer LEL to hermetically seal the device layer LEL. The encapsulation layer ECL may have a double-layered structure, referred to as a thin film encapsulation (TFE). The encapsulation layer ECL may include an inorganic layer, an organic layer, or both of the inorganic layer and the organic layer. The display panel DP may include an encapsulation substrate and a sealant that replace the encapsulation layer ECL. The sealant may be used to couple the encapsulation substrate to the device layer LEL.

The display panel DP and the protection film PF may be combined to each other by the fourth adhesive element AM4. A rear surface of the base layer BL and the protection film PF may be combined to each other by the fourth adhesive element AM4. The fourth adhesive element AM4 may include a first adhesive portion AM4-1 and a second adhesive portion AM4-2 that correspond to the first protection film PF1 and the second protection film PF2, respectively.

As shown in FIG. 3D, the display panel DP may include two regions. As shown in FIG. 3C, the display panel DP may be divided into a non-bending region NBA and a bending region BA. When the display panel DP is in a bent state, the bending region BA may include a curvature region CA that is bent with a specific curvature, and a facing region FA that is located to face the non-bending region NBA.

The base layer BL and the circuit layer CL may be provided to correspond to the non-bending region NBA and the bending region BA. The device layer LEL and the encapsulation layer ECL may be disposed in the non-bending region NBA.

The first protection film PF1 may correspond to the non-bending region NBA. The first adhesive portion AM4-1 may be used for coupling between the non-bending region NBA of the base layer BL and the first protection film PF1. The second protection film PF2 and the second adhesive portion AM4-2 may correspond to the facing region FA. The first protection film PF1 and the second protection film PF2 may be spaced apart from each other with the curvature region CA interposed therebetween.

The display panel DP may further include a stress control film SCF that is disposed on the circuit layer CL to correspond at least the curvature region CA. The stress control film SCF may be disposed on the curvature region CA. A portion of the stress control film SCF may also be overlapped with the non-bending region NBA and the facing region FA. For example, a portion of the stress control film SCF corresponding to the curvature region CA is larger than 70% of the total area of the stress control film SCF. The stress control film SCF may include a plastic film, similar to the protection film PF. In some embodiments, when the display panel DP is in the bent state, the curvature region CA may have a neutral surface, and the stress control film SCF may be configured to place the neutral surface of the curvature region CA adjacent to the circuit layer CL.

In the example shown in FIGS. 3B to 3D, each of the protection film PF and the fourth adhesive element AM4 has been described to include two portions, but in certain embodiments, each of the protection film PF and the fourth adhesive element AM4 may have a slit that is provided at a region corresponding to the curvature region CA.

A planar shape of the display panel DP in the unfolded state will be described in more detail with reference to FIG. 3A. A width of the display panel DP in the first direction DR1 may not be uniform depending on a position thereof. The bending region BA may have a width smaller than that of the non-bending region NBA. Since the bending region BA has a relatively small width, the bending region BA may be easily bent.

FIG. 3A illustrates an example in which the display panel DP is configured to include a first region having a small width in the first direction DR1, a second region having a large width in the first direction DR1, and a boundary region therebetween. A width in the first direction DR1 of the boundary region may decrease with increasing distance from the non-bending region NBA. The boundary region may be included in one of the bending region BA and the non-bending region NBA. In some embodiments, the boundary region may be omitted, and the first region having the small width in the first direction DR1 may be directly connected to the second region having the large width in the first direction DR1.

Referring back to FIGS. 3B and 3C, when the display panel DP is in the unfolded state, the curvature region CA may be positioned adjacent to the facing region FA and the non-bending region NBA, and when the display panel DP is in the bent state, the facing region FA may be positioned to face the non-bending region NBA in the thickness direction DR3 of the display module DM. When the display panel DP is in the bent state, the bending region BA may be bent along a bending axis BX to have a specific curvature radius.

The circuit layer CL may include one or more pads. The pads of the circuit layer CL may be aligned at a side region of the facing region FA. The facing region FA may be coupled to the second circuit board FCB. When the display panel DP is in the bent state, the first circuit board MCB and the second circuit board FCB may face a rear surface of the display panel DP.

The protection film PF may not be disposed in the curvature region CA. In certain embodiments, a slit may be defined in the protection film PF to correspond to the curvature region CA. Since the protection film PF is not disposed in the curvature region CA, a stress exerted on the circuit layer CL may be reduced during the bending process. A region of the fourth adhesive element AM4 corresponding to the curvature region CA may also be removed, but the inventive concept is not limited thereto.

In some embodiments, the protection film PF may have a groove defined to correspond to the curvature region CA. For example, a portion of the protection film PF in the curvature region CA may have a thickness smaller than other portions that are positioned in other regions (e.g., the facing region FA and the non-bending region NBA) or may be at least partially removed, thereby having a patterned shape.

The protection film PF and the support panel SPP may be combined to each other by the fifth adhesive element AM5. The support panel SPP and the force sensing unit FSU may be combined to each other by the sixth adhesive element AM6.

When the display panel DP is in the bent state, the second protection film PF2 and the support panel SPP may be combined to each other by the seventh adhesive element AM7. The seventh adhesive element AM7 may serve as a spacer between the second protection film PF2 and the support panel SPP, allowing the curvature region CA to be maintained at a predetermined curvature radius.

The first circuit board MCB and the second circuit board FCB may be electrically connected to each other through a conductive element CAM that is disposed between the first circuit board MCB and the second circuit board FCB in the thickness direction DR3 of the display module DM. The conductive element CAM may also be configured to physically connect the first circuit board MCB to the second circuit board FCB.

The conductive element CAM may include an anisotropic conductive film (ACF) that has good adhesion characteristics while preventing a short circuit between adjacent pads. In some embodiments, the conductive element CAM may also include a solder paste, a solder ball, or a solder bump.

The first circuit board MCB and the second circuit board FCB may be combined to each other by the eighth adhesive element AM8 that is disposed between the first circuit board MCB and the second circuit board FCB in the thickness direction DR3 of the display module DM. The eighth adhesive element AM8 may reduce a stress exerted on the conductive element CAM during the bending process. The eighth adhesive element AM8 will be described in more detail below.

Although not shown in FIGS. 3A to 3D, the display device DD may further include a ninth adhesive element that is provided to connect the first circuit board MCB to an underlying element (e.g., the support panel SPP and/or the force sensing unit FSU) disposed on the rear surface of the display module DM. The ninth adhesive element will be described in more detail below.

Figure 4A:
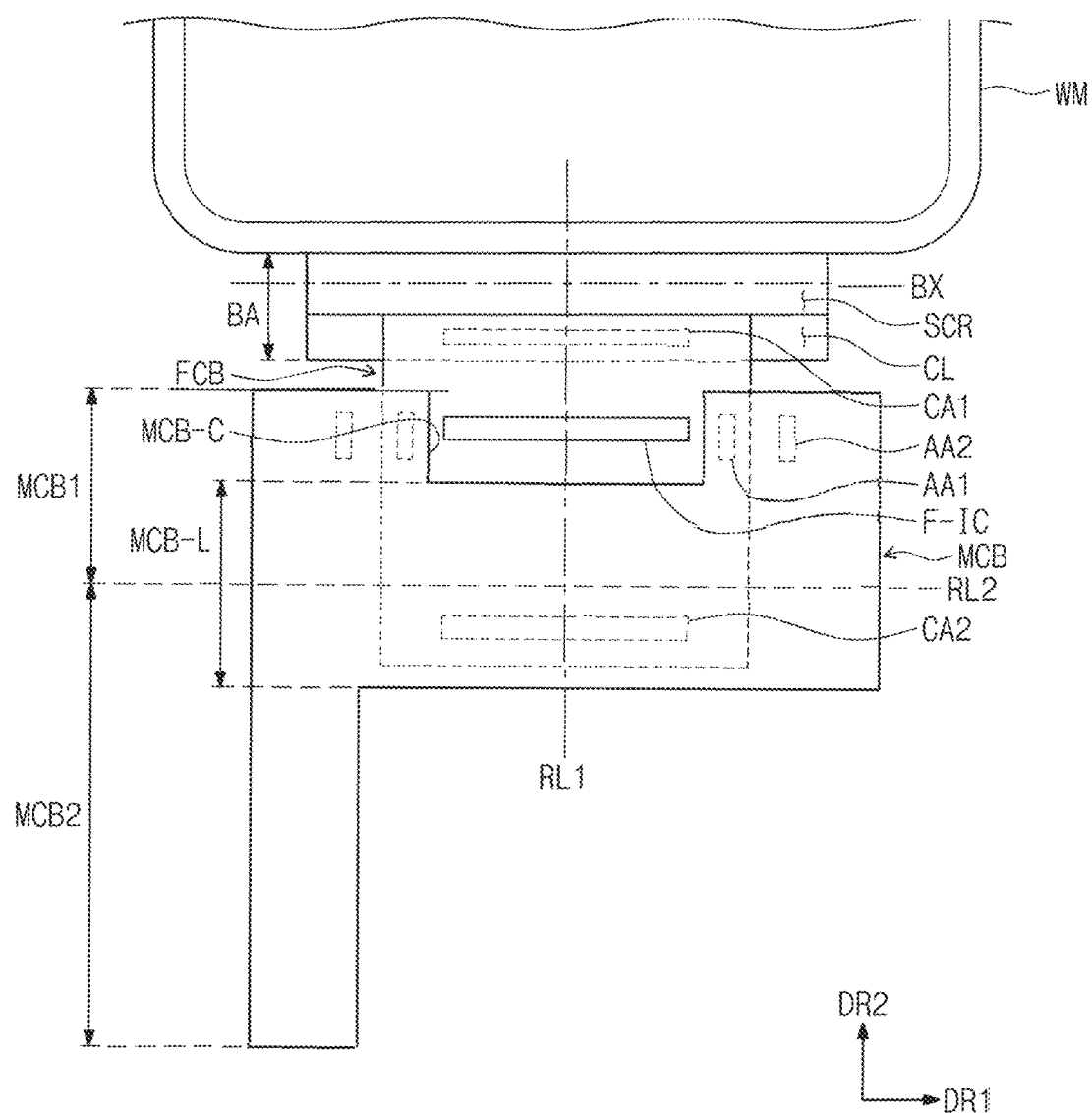
FIG. 4A is a first plan view illustrating a portion of a display device according to some embodiments of the inventive concept.
Figure 4B:
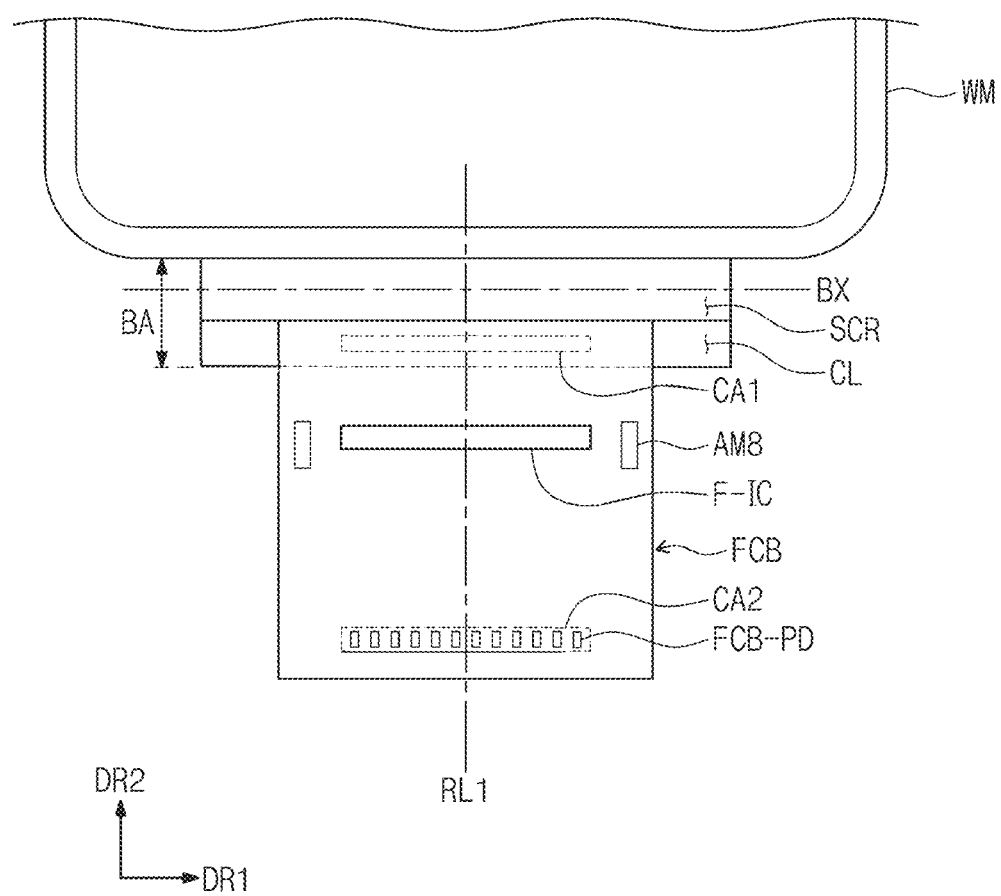
FIG. 4B is a second plan view illustrating a portion of a display device according to some embodiments of the inventive concept.
Figure 4C:
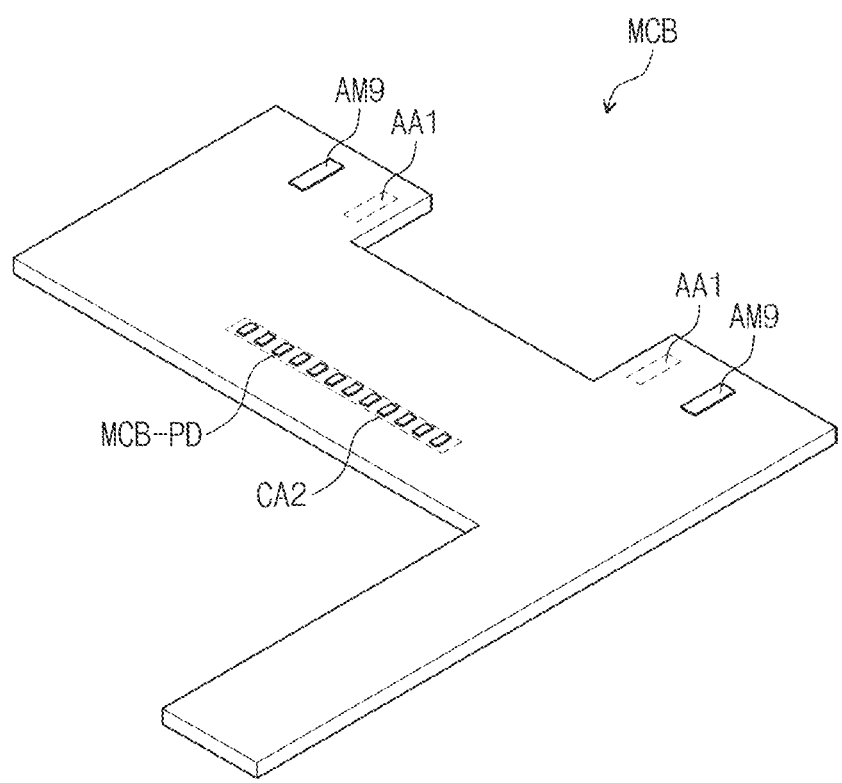
FIG. 4C is a perspective view illustrating a bottom surface of a first circuit board according to some embodiments of the inventive concept.
Figure 4D:
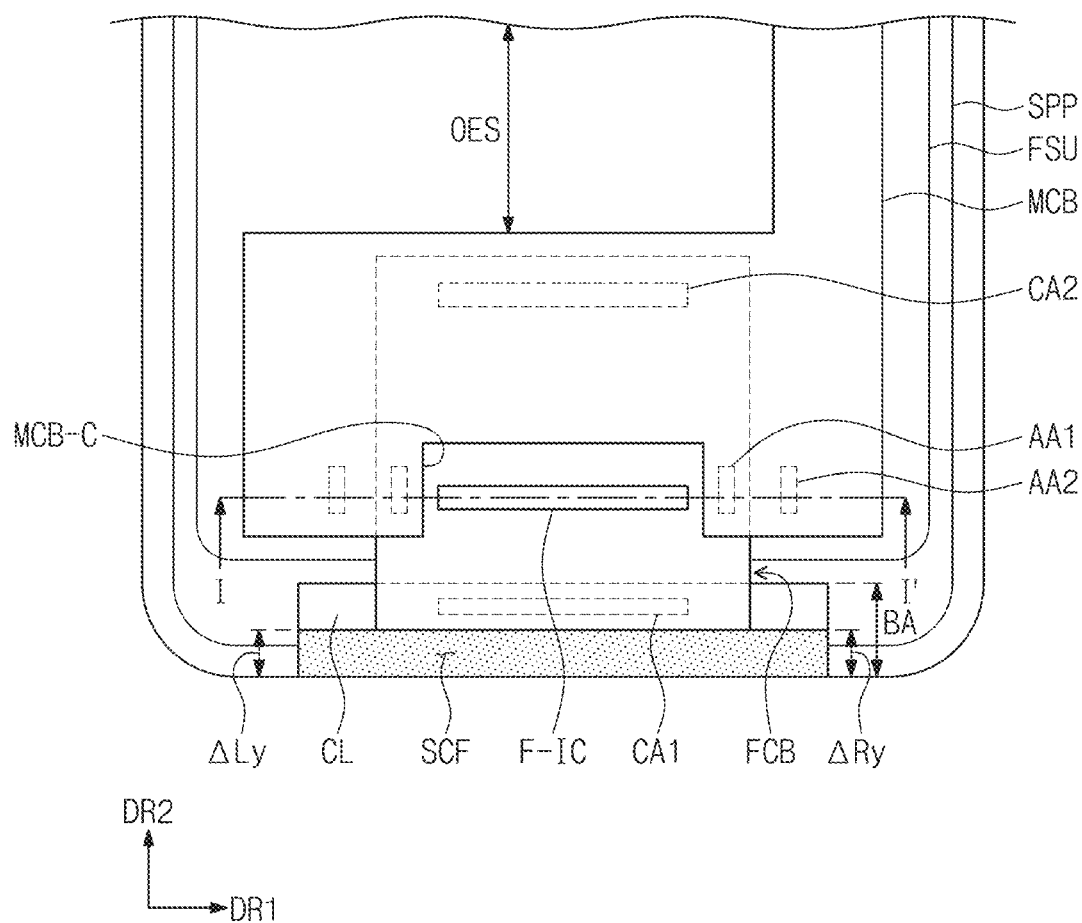
FIG. 4D is a third plan view illustrating a portion of a display device according to some embodiments of the inventive concept.
Figure 4E:
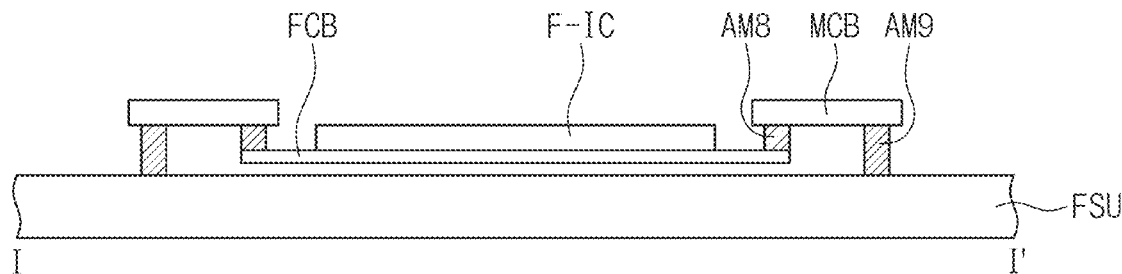
FIG. 4E is a sectional view illustrating a portion of a display device according to some embodiments of the inventive concept.
Figure 4F:
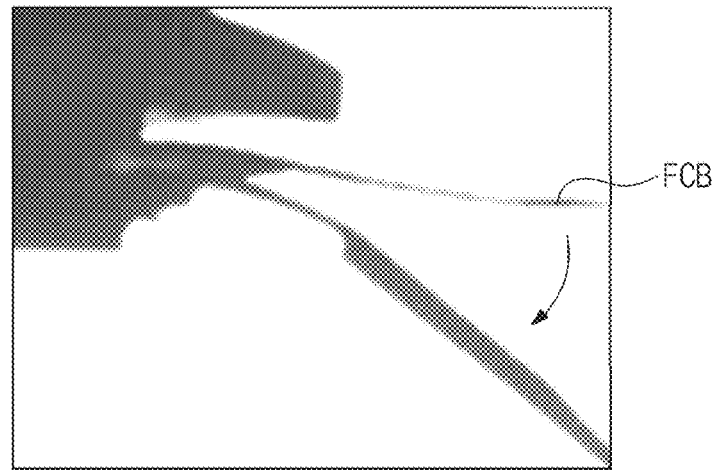
FIGS. 4F and 4G are photographic images showing side profiles of display devices that are respectively fabricated by methods according to some embodiments of the inventive concept and according to a comparative example.
Figure 4G:
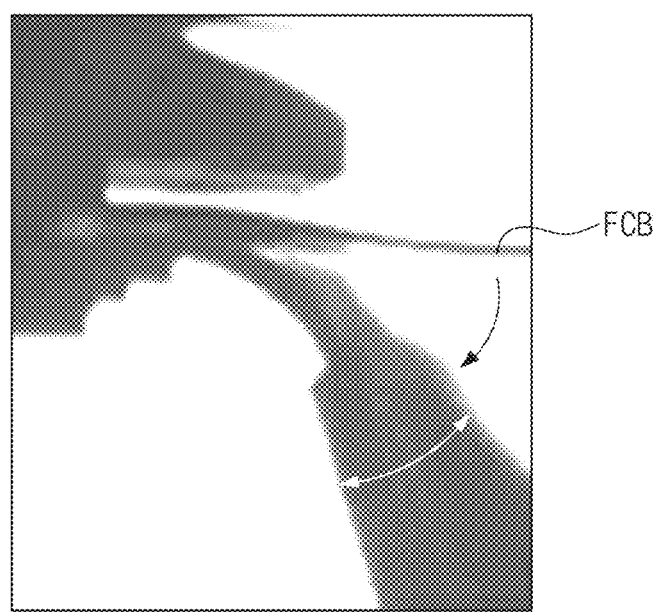

FIG. 4A is a first plan view illustrating a portion of the display device DD according to some embodiments of the inventive concept. FIG. 4B is a second plan view illustrating a portion of the display device DD according to some embodiments of the inventive concept. FIG. 4C is a perspective view illustrating a bottom surface of the first circuit board MCB according to some embodiments of the inventive concept. FIG. 4D is a third plan view illustrating a portion of the display device DD according to some embodiments of the inventive concept. FIG. 4E is a sectional view illustrating a portion of the display device DD according to some embodiments of the inventive concept. FIGS. 4F and 4G are photographic images showing side profiles of display devices that are respectively fabricated by methods according to some embodiments of the inventive concept and according to a comparative example.

FIG. 4A illustrates a plan view corresponding to FIG. 3B, and FIG. 4B illustrates the display device DD of FIG. 4A, from which the first circuit board MCB is removed. FIG. 4D illustrates a plan view corresponding to FIG. 3C, and FIG. 4E illustrates a vertical section corresponding to line I-I' of FIG. 4D. For concise description, a previously described element may be identified by a similar or identical reference number without repeating overlapping description thereof.

In the following description of FIGS. 4A to 4E, a front surface and a rear surface of each member will be described based on the configuration shown in FIG. 4A. Even when a portion of the display panel DP is bent, a front surface and a rear surface of the bent portion will be described based on the configuration shown in FIG. 4A.

As shown in FIGS. 4A to 4E, a first coupling region CA1 may be defined as a region, in which pads of the circuit layer CL are coupled to pads of the second circuit board FCB. In the first coupling region CA1, the pads of the circuit layer CL may be exposed on the front surface of the circuit layer CL or the front surface of the display panel DP, and the pads of the second circuit board FCB may be exposed on the rear surface of the second circuit board FCB. The pads of the circuit layer CL may be electrically connected to the pads of the second circuit board FCB through an anisotropic conductive film, a solder paste, or a solder ball.

A second coupling region CA2 may be defined as a region, in which the pads of the second circuit board FCB are coupled to pads of the first circuit board MCB. In the second coupling region CA2, the pads of the second circuit board FCB may be exposed on the front surface of the second circuit board FCB, and the pads of the first circuit board MCB may be exposed on the rear surface of the first circuit board MCB. FIG. 4B illustrates pads FCB-PD that are exposed on the front surface of the second circuit board FCB, and FIG. 4C illustrates pads MCB-PD exposed on the rear surface of the first circuit board MCB.

The pads of the second circuit board FCB may be electrically connected to the pads of the first circuit board MCB through an anisotropic conductive film, a solder paste, or a solder ball.

On a plane defined by the first direction axis DR1 and the second direction axis DR2, each of the regions, on which the eighth adhesive element AM8 and the ninth adhesive element AM9 are provided, may be defined as an adhesion region. The plane defined by the first direction axis DR1 and the second direction axis DR2 may be parallel to the rear or front surface of the display panel DP and/or the display module DM.

A region, on which the eighth adhesive element AM8 is provided, may be defined as a first adhesion region AA1, and a region, on which the ninth adhesive element AM9 is provided, may be defined as a second adhesion region AA2. FIG. 4B illustrates the eighth adhesive element AM8 attached to the front surface of the second circuit board FCB, and FIG. 4C illustrates the ninth adhesive element AM9 attached to the rear surface of the first circuit board MCB.

In some embodiments, a plurality of the first adhesion regions AA1 and a plurality of the second adhesion regions AA2 may be provided. The number of the first adhesion regions AA1 may be equal to or different from the number of the second adhesion regions AA2. FIG. 4A illustrates an example in which a pair of the first adhesion regions AA1 and a pair of the second adhesion regions AA2 are provided.

During the process of bending the display panel DP to combine the second circuit board FCB and the first circuit board MCB by the eighth adhesive element AM8, stress may be exerted on the second coupling region CA2. The second circuit board FCB and the first circuit board MCB may be combined with each other at a plurality of positions in the second direction DR2.

The bending axis BX may be parallel to the first direction axis DR1. An imaginary line (hereinafter, a first reference line RL1) that is perpendicular to the bending axis BX and the first direction axis DR1 and is substantially parallel to the second direction axis DR2 may be set in the second circuit board FCB. The first reference line RL1 may bisect a width of the second circuit board FCB in the first direction DR1.

The plurality of the first adhesion regions AA1 may be symmetrically disposed with respect to the first reference line RL1. For example, the first adhesion regions AA1 may include a first group that includes one or more first adhesion regions AA1 positioned at one side of the first reference line RL1, and a second group that includes one or more first adhesion regions AA1 positioned at an opposite side of the first reference line RL1. The first and second groups of the first adhesion regions AA1 may be symmetrically provided with respect to the first reference line RL1 to uniformly combine the second circuit board FCB and the first circuit board MCB. The symmetry of the first adhesion regions AA1 with respect to the first reference line RL1 may allow an external force to be uniformly exerted in the bending region BA during the bending process.

FIG. 4F shows a result of the bending process of the display device DD according to the present embodiment. Referring to FIG. 4F, since the first adhesion regions AA1 are arranged in a symmetrical manner, the bending region BA may have a uniform curvature radius. Even if the curvature radius varies depending on a bending state, the curvature radius may be uniquely defined regardless of a region. That is, the second circuit board FCB may not be twisted or distorted during the bending process, and thus, a side profile of the second circuit board FCB has a line shape, as shown in photographic image of FIG. 4F. When the display panel DP is in the bent state, the curvature radius may be substantially uniform when measured along the direction of the bending axis BX. The uniform curvature radius may prevent a damage or a crack that may occur in the comparative example to be described below.

FIG. 4G shows a result of the bending process of the display device DD according to a comparative example. Referring to FIG. 4G, the first adhesion regions AA1 may be arranged in an asymmetrical manner, thus the stress exerted on the bending region BA may be non-uniform. Accordingly, the second circuit board FCB may be twisted or distorted during the bending process, and thus, a side profile of the second circuit board FCB has a relatively large area, as shown in the photographic image of FIG. 4G.

When the display panel DP is in the bent state, the curvature radius of the bending region BA may be varied in the direction of the bending axis BX. Owing to the asymmetry of the bending region BA, stress may be concentrated on a specific portion of the display panel DP in the bent state. Such a specific portion may be located near, for example, a boundary between the bending region BA and the non-bending region NBA. The stress may lead to a crack of a signal line, a semiconductor pattern, or an organic thin-film near the boundary.

As shown in FIG. 4E, the ninth adhesive element AM9 may be used to combine the first circuit board MCB to an underlying element, when the display panel DP is in the bent state. In the present embodiment shown in FIG. 3C, the underlying element is the force sensing unit FSU. The first circuit board MCB is combined to the force sensing unit FSU using the ninth adhesive element AM9 to maintain the display panel DP in the bent state.

The plurality of the first adhesion regions AA1 may also be symmetrically arranged with respect to the first reference line RL1. Accordingly, the bending region BA may be maintained at a specific curvature radius.

in certain embodiments, the first circuit board MCB may have an asymmetric shape with respect to the first reference line RL1. As shown in FIG. 4A, the first circuit board MCB may include a first region MCB1 and a second region MCB2 that are divided based on a second reference line RL2. The second reference line RL2 may be parallel to the bending axis BX and the first direction axis DR1.

The second reference line RL2 may bisect a length MCB-L of the first circuit board MCB measured along the first reference line RL1. The bending region BA may be closer to the first region MCB1 than the second region MCB2.

The conductive element CAM (i.e., the second coupling region CA2) may be overlapped with the second region MCB2. The first circuit board MCB and the second circuit board FCB may be coupled to each other with a relatively large overlapping area in the second region MCB2, whereas in the conventional case, a pad region located at an edge of the circuit board is used for connection with the circuit board.

Since an overlapping area between the first circuit board MCB and the second circuit board FCB is relatively large, an electronic module may be disposed in a region in which the first circuit board MCB and the second circuit board FCB of the display device DD are not overlapped with each other to effectively use a space of the electronic device ED (e.g., see FIG. 1).

The driving chip F-IC may be disposed on the front surface of the second circuit board FCB in a cut region MCB-C that is defined in the first region MCB1 of the second circuit board FCB. The driving chip F-IC disposed in the cut region MCB-C makes it possible to more effectively use the space of the electronic device ED. The driving chip F-IC and the plurality of first adhesion regions AA1 may be aligned to be arranged along common line that is parallel to the first direction DR1.

In certain embodiments, the first circuit board MCB may be provided to have a symmetric shape with respect to the first reference line RL1, but the inventive concept is not limited to a specific shape of the first circuit board MCB.

FIGS. 5A to 5D are plan views illustrating arrangements of eighth adhesive elements AM8 in the display device DD according to some embodiments of the inventive concept. For concise description, elements previously described with reference to FIGS. 4A to 4G may be identified by a similar or identical reference number without repeating overlapping description thereof. The technical features of the first adhesion region AA1 to be described below may be equally applied to the second adhesion region AA2 shown in FIGS. 4A to 4D.

As described above, the first adhesion regions AA1 on which the eighth adhesive element AM8 is provided may be symmetrically arranged with respect to the first reference line RL1. Hereinafter, some features of the inventive concept associated with the symmetric arrangement of the first adhesion regions AA1 with respect to the first reference line RL1 will be described in more detail with reference to FIG. 4A and FIGS. 5A to 5D.

Referring to FIG. 4B, the eighth adhesive element AM8 may have the same number at both sides of the first reference line RL1. For example, a pair of the eighth adhesive elements AM8 may be placed one on each side of the first reference line RL1. The pair of the eighth adhesive elements AM8 may have the same area and the same shape. The pair of the eighth adhesive elements AM8 may be placed at positions that are symmetric with respect to the first reference line RL1.

Figure 5A:
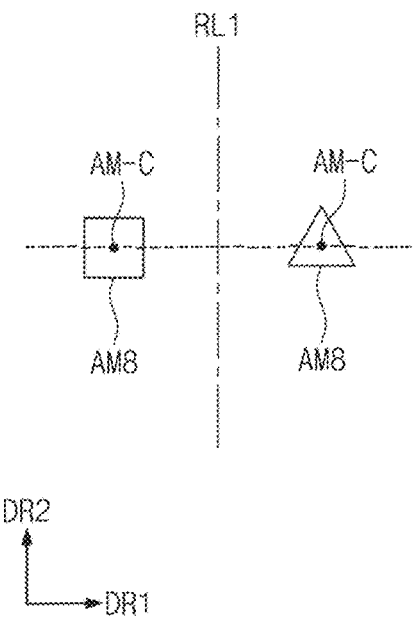
FIGS. 5A to 5D are plan views illustrating arrangements of eighth adhesive elements in a display device according to some embodiments of the inventive concept.

As shown in FIG. 5A, a corresponding pair of the eighth adhesive elements AM8 may have the same area but may differ from each other in their shapes. A center AM-C of the first adhesion region positioned at one side and the center AM-C of the first adhesion region positioned at an opposite side may be symmetric with respect to the first reference line RL1. A center of mass of the eighth adhesive element AM8 may be substantially identical to the center of the corresponding first adhesion region AA1.

Figure 5B:
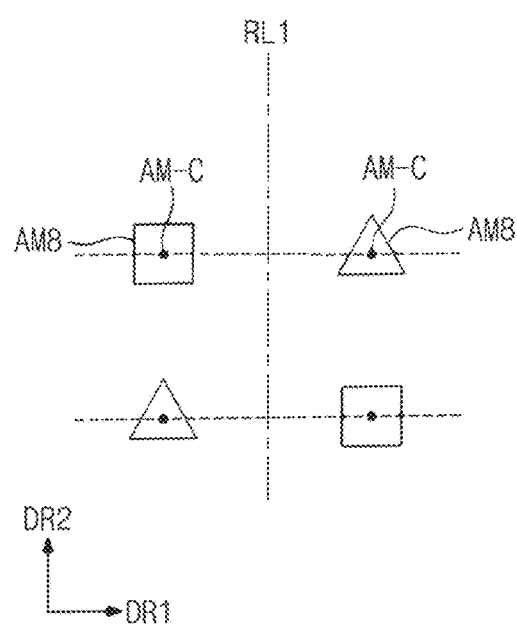

As shown in FIG. 5B, combination of the eighth adhesive elements AM8 disposed at one side of the first reference line RL1 may be the same as that at an opposite side of the first reference line RL1, but the disposition of the eighth adhesive elements AM8 in each side may be different from each other.

Figure 5C:
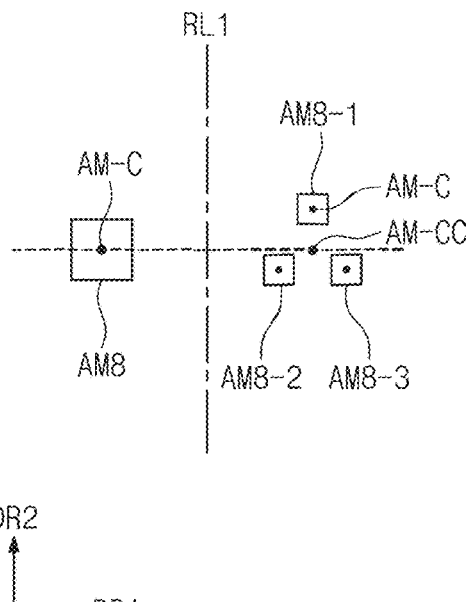

As shown in FIG. 5C, the eighth adhesive elements AM8 at both sides of the first reference line RL1 may differ from each other in their numbers. For example, n eighth adhesive elements AM8 may be disposed at one side of the first reference line RL1, and m eighth adhesive elements AM8 may be disposed at an opposite side of the first reference line RL1, where n and m are natural numbers larger than or equal to 1. FIG. 5C illustrates an example, in which one eighth adhesive element AM8 is provided at one side, and three eighth adhesive elements AM8-1 to AM8-3 corresponding thereto are provided at the opposite side.

Centers of n first adhesion regions and centers of m first adhesion regions may be symmetric with respect to the first reference line RL1. Herein, a center AM-CC of the three eighth adhesive elements AM8-1 to AM8-3 may be defined as a center of the individual centers AM-C of the three eighth adhesive elements AM8-1 to AM8-3. Herein, a center may refer to either a geographic center or a mass center. In some embodiments, the geographic center and the mass center may be interchangeably used when the adhesive elements have a uniform density and thickness. The center AM-C of the one eighth adhesive element AM8 at one side and the center AM-CC of the three eighth adhesive element AM8-1 to AM8-3 at the opposite side may be located at positions that are symmetric with respect to the first reference line RL1. Here, a total area of the n eighth adhesive elements may be the same as a total area of the m first eighth adhesive elements.

Figure 5D:
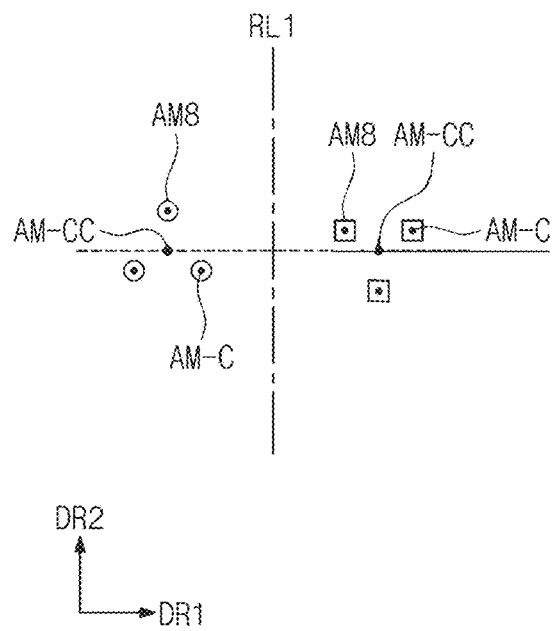

As shown in FIG. 5D, the number of the eighth adhesive elements AM8 disposed at one side of the first reference line RL1 may be two or more and may be the same as that at an opposite side. The eighth adhesive elements AM8 disposed at one side of the first reference line RL1 may differ from the eighth adhesive elements AM8 disposed at the opposite side of the first reference line RL1 in terms of their shapes and areas. The center AM-CC of the eighth adhesive elements AM8 disposed at one side and the center AM-CC of the eighth adhesive elements AM8 disposed at the opposite side may be located at positions that are symmetric with respect to the first reference line RL1. Here, the eighth adhesive elements AM8 disposed at one side may have the same total area as that of the eighth adhesive elements AM8 disposed at the opposite side.

At least one of the eighth adhesive elements AM8 provided at one side may be different from others in terms of their areas and shapes. At least one of the eighth adhesive elements AM8 disposed at the opposite side may also be different from others in terms of their areas and shapes. The center AM-CC may be determined depending on the shapes and areas of the eighth adhesive elements AM8.

FIGS. 6A to 6E are plan views each illustrating the first circuit board MCB according to some embodiments of the inventive concept. As described with reference to FIGS. 4A and 5A to 5D, a plurality of first adhesion regions may be symmetrically disposed with respect to the first reference line RL1. FIGS. 6A to 6E illustrate some examples of the eighth adhesive elements AM8 disposed in the first adhesion regions.

Figure 6A:
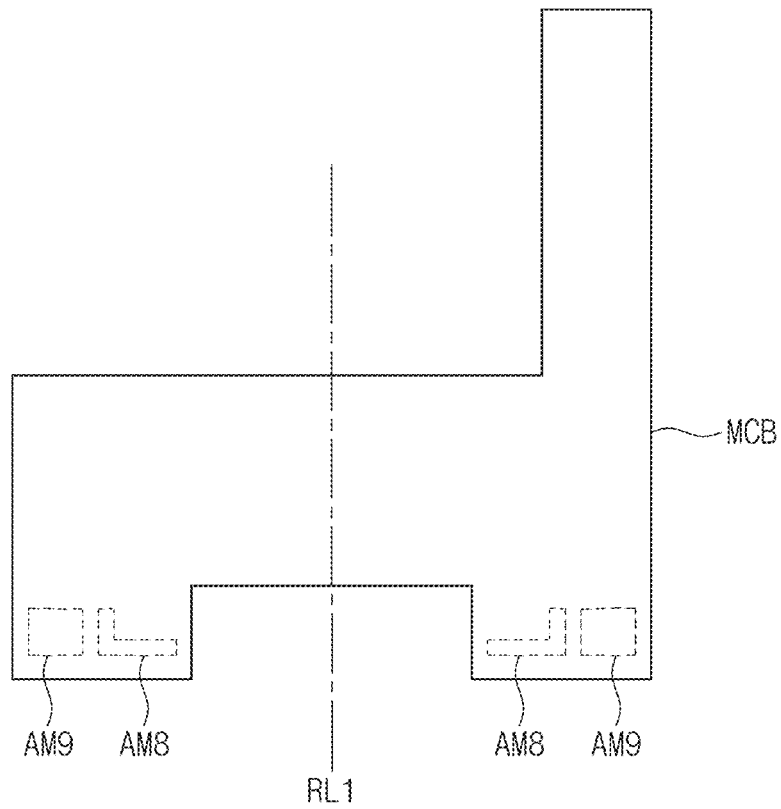
FIGS. 6A to 6E are plan views each illustrating a first circuit board according to some embodiments of the inventive concept.

As shown in FIG. 6A, the eighth adhesive element AM8 having a shape of a letter "L" may be disposed at a left side of the first reference line RL1. The eighth adhesive element AM8 having a shape of bilateral symmetry to a letter "L" may be disposed at a right side of the first reference line RL1. As shown in FIGS. 6A to 6E, the ninth adhesive elements AM9 may also be symmetrically provided with respect to the first reference line RL1.

Figure 6B:
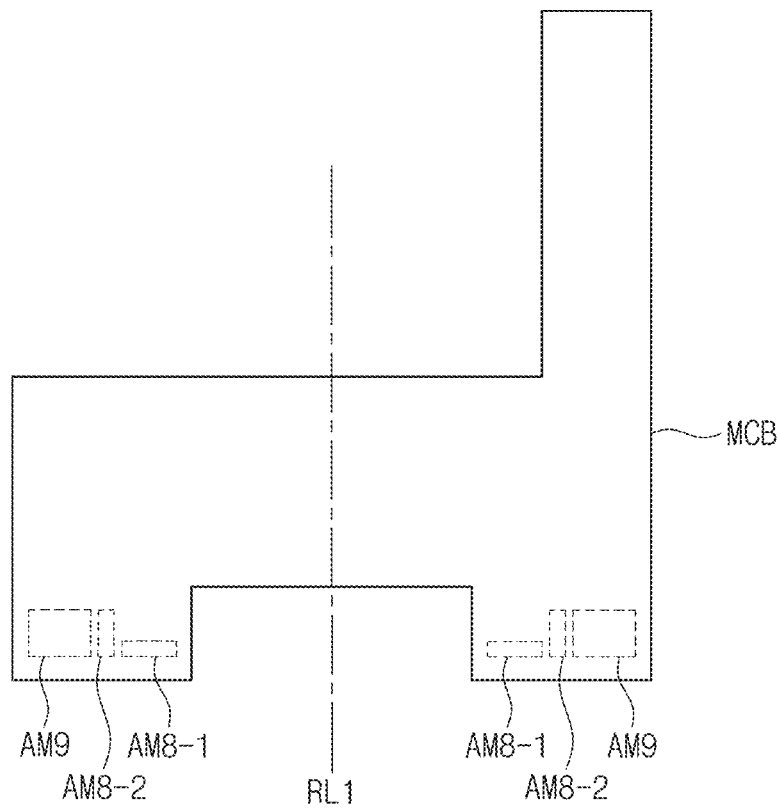
Figure 6C:
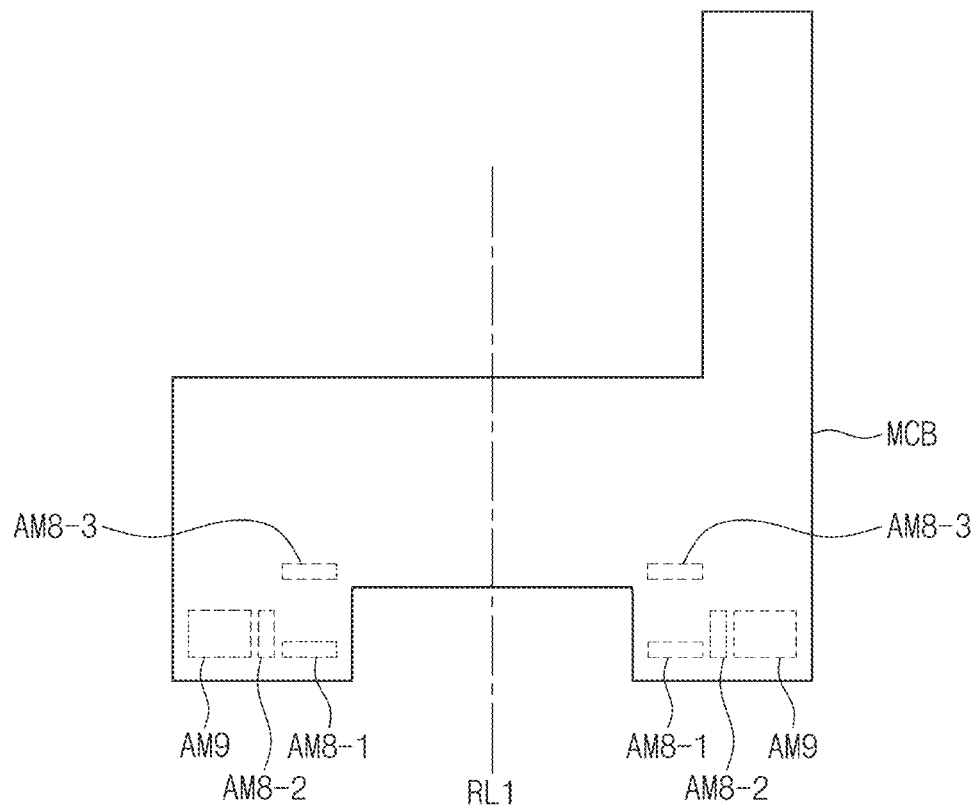

As shown in FIG. 6B, two eighth adhesive elements AM8 having different shapes may be disposed at each side of the first reference line RL1. The two eighth adhesive elements AM8-1 and AM8-2 at the left side and the two eighth adhesive elements AM8-1 and AM8-2 at the right side may be arranged in a bilaterally symmetric manner. FIG. 6C illustrates an example of the first circuit board MCB, on which the eighth adhesive elements AM8-1, AM8-2, and AM8-3 are arranged in a different manner.

Figure 6D:
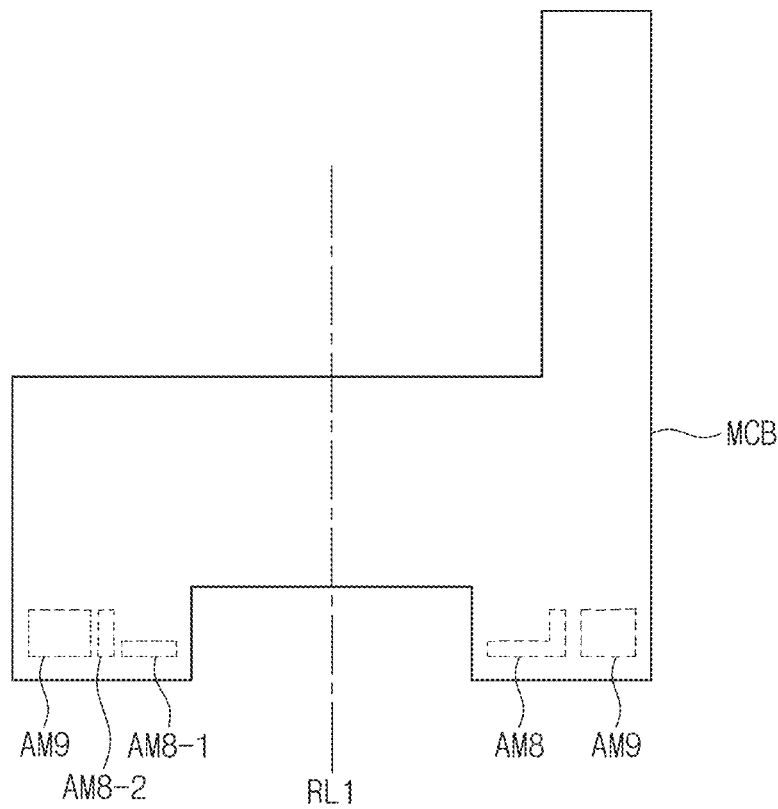

As shown in FIG. 6D, the numbers of the eighth adhesive elements AM8 disposed at both sides of the first reference line RL1 may be different from each other. FIG. 6D illustrates an example in which two eighth adhesive elements AM8-1 and AM8-2 are disposed at a left side of the first reference line RL1 and one eighth adhesive element AM8 is disposed at a right side of the first reference line RL1. The two eighth adhesive elements AM8-1 and AM8-2 may be arranged to form substantially the same shape as that of the eighth adhesive element AM8 at the right side. A center of the two eighth adhesive elements AM8-1 and AM8-2 and a center of the one eighth adhesive element AM8 may be located at positions that are substantially symmetric with respect to the first reference line RL1.

Figure 6E:
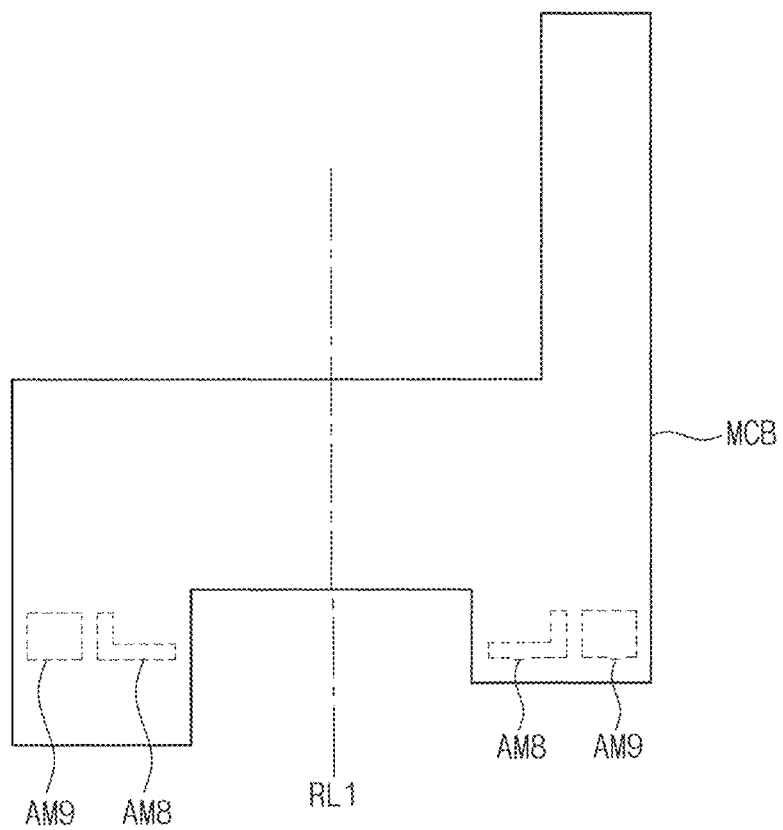

As shown in FIGS. 6A to 6D, a region of the first circuit board MCB, on which the eighth adhesive elements AM8 are disposed, may have a bilaterally symmetric shape with respect to the first reference line RL1. However, the inventive concept is not limited thereto, and a region of the first circuit board MCB, on which the eighth adhesive elements AM8 are disposed, may have an asymmetric shape with respect to the first reference line RL1 as shown in FIG. 6E.

Figure 7A:
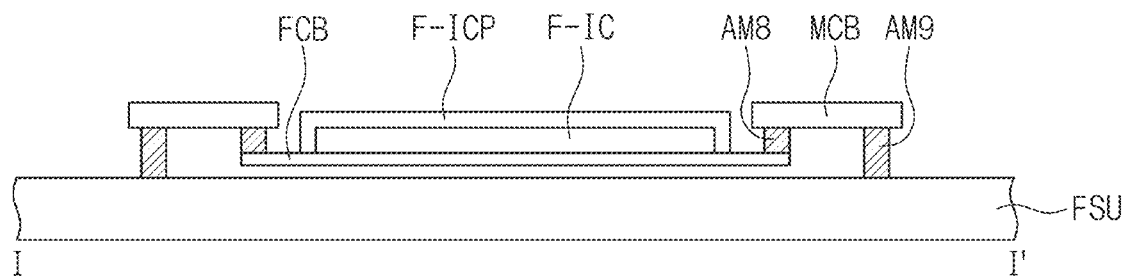
FIGS. 7A and 7B are sectional views each partially illustrating a display device according to some embodiments of the inventive concept.
Figure 7B:
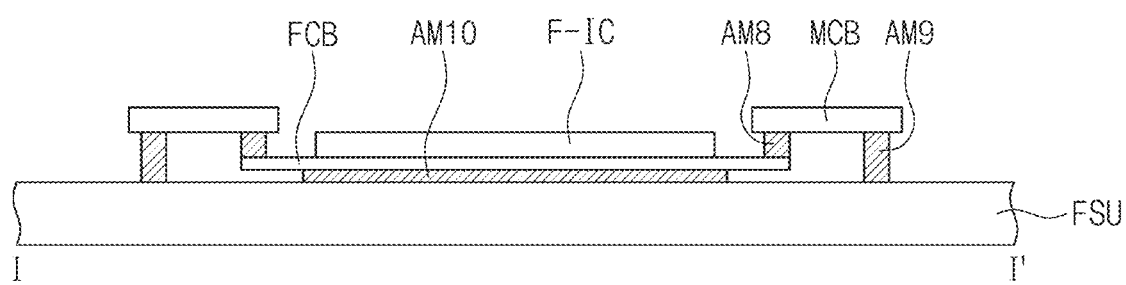

FIGS. 7A and 7B are sectional views each partially illustrating the display device DD according to some embodiments of the inventive concept. Sections of FIGS. 7A and 7B correspond to that of FIG. 4E. For concise description, an element previously described with reference to FIGS. 4A to 4G may be identified by a similar or identical reference number without repeating overlapping description thereof.

As shown in FIG. 7A, a protection member F-ICP may be further disposed on the front surface of the second circuit board FCB to protect the driving chip F-IC. The protection member F-ICP may include an adhesive element such as a PSA film. The protection member F-ICP may include a plastic film that is attached to the second circuit board FCB by an adhesive element, or a metal can that is attached to the second circuit board FCB by soldering. The protection member F-ICP may be disposed on the front surface of the second circuit board FCB to be completely overlapped with the driving chip F-IC. The protection member F-ICP may enclose a side surface of the driving chip F-IC.

As shown in FIG. 7B, a tenth adhesive element AM10 may be further provided to couple the rear surface of the second circuit board FCB and an underlying element. The underlying element may be the support panel SPP or the force sensing unit FSU. Since the second circuit board FCB is adhesively combined with the underlying element by the tenth adhesive element AM10, it may be possible to control the flexibility of the second circuit board FCB.

For example, in the case where the electronic device ED is dropped or collides with an external object (e.g., the ground), an impact force may cause severe vibration of the second circuit board FCB in a thickness direction of the force sensing unit FSU. In this case, a crack may occur in a coupling region between the driving chip F-IC and the second circuit board FCB. The tenth adhesive element AM10 may suppress the vibration of the second circuit board FCB caused by the impact, thereby preventing a crack from occurring in the coupling region between the driving chip F-IC and the second circuit board FCB.

Figure 8A:
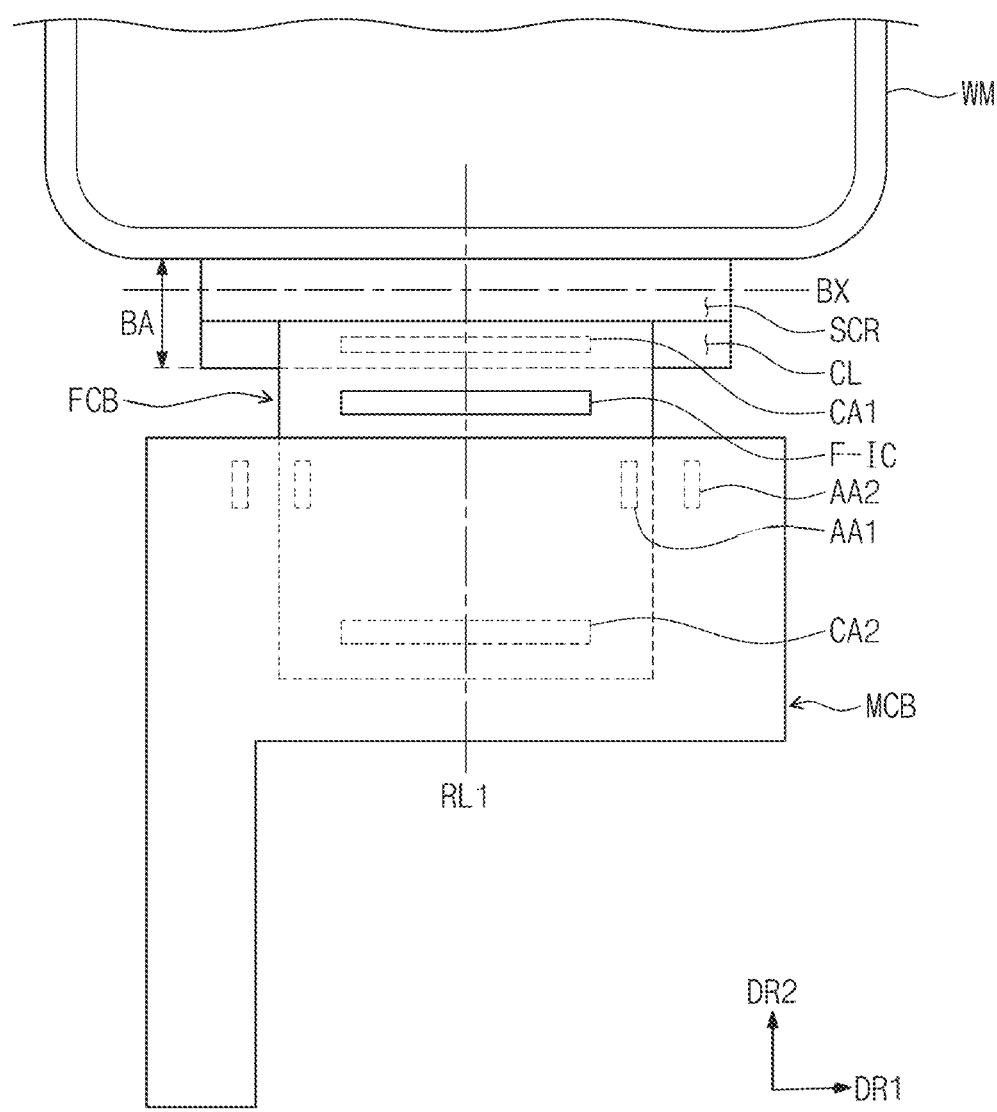
FIGS. 8A to 8C are first plan views each partially illustrating display devices according to some embodiments of the inventive concept.
Figure 8B:
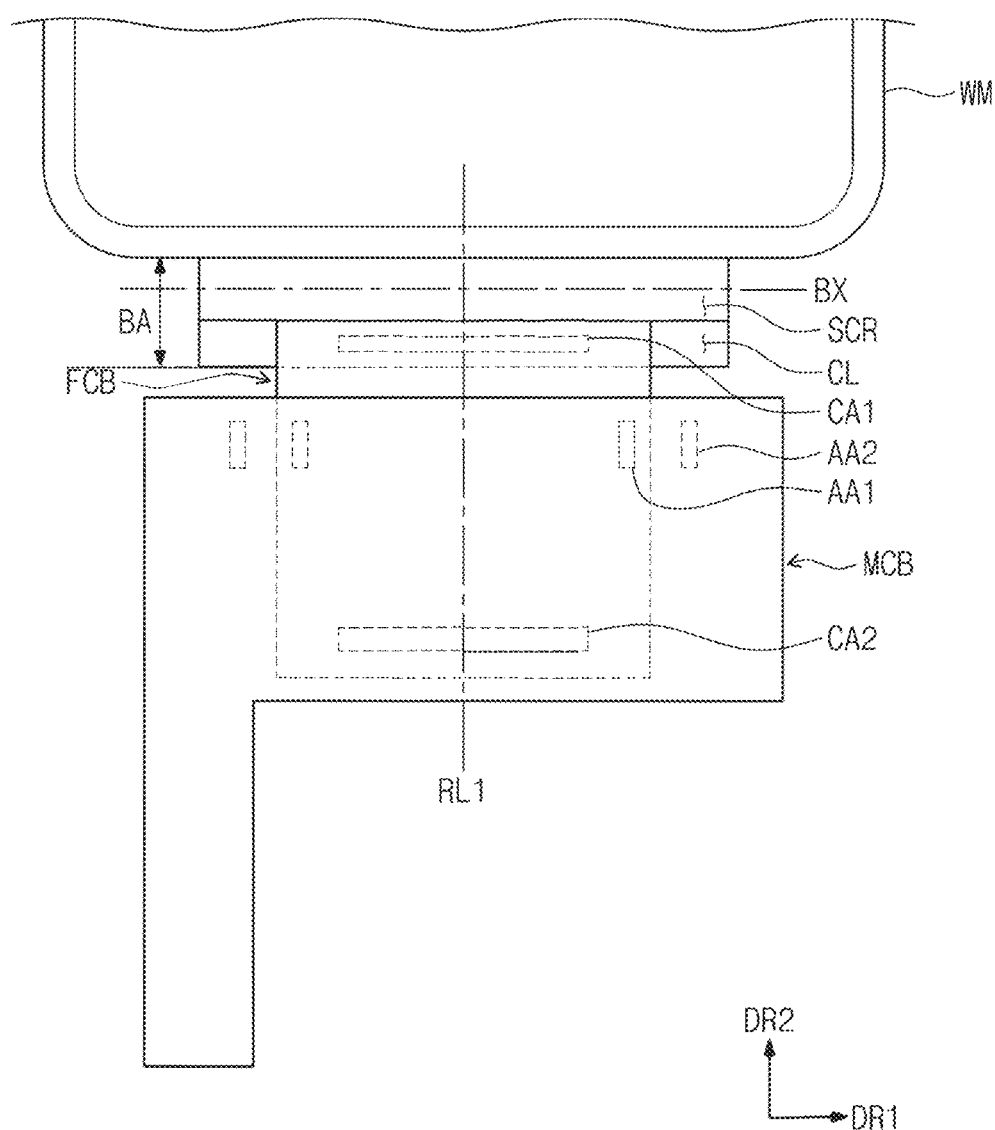
Figure 8C:
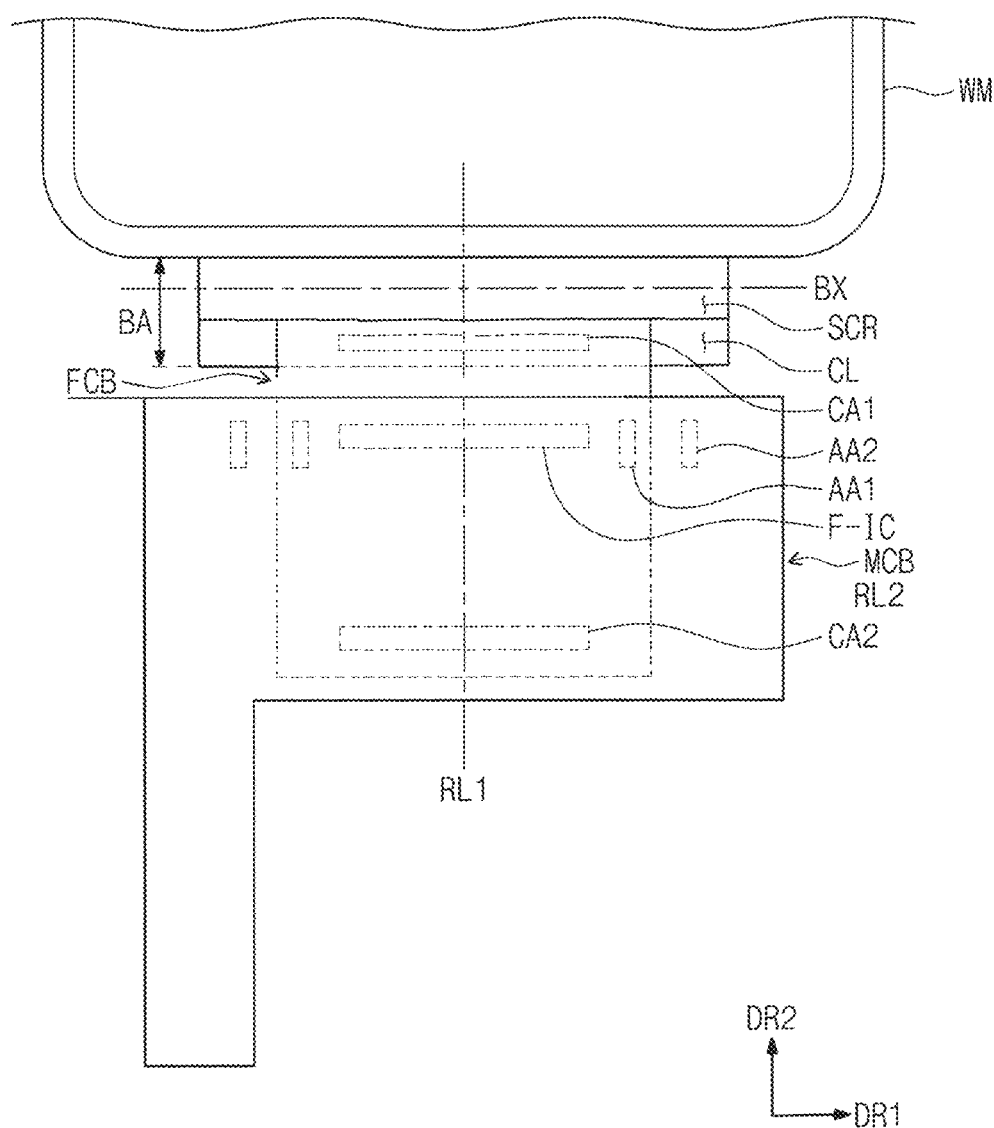

FIGS. 8A to 8C are first plan views each partially illustrating the display device DD according to some embodiments of the inventive concept. Plan views of FIGS. 8A to 8C correspond to that of FIG. 4A. For concise description, an element previously described with reference to FIGS. 4A to 4G may be identified by a similar or identical reference number without repeating overlapping description thereof.

As shown in FIGS. 8A to 8C, the cut region MCB-C shown in FIG. 4A may not be defined in the first circuit board MCB. As shown in FIG. 8B, the driving chip F-IC shown in FIGS. 4A and 8A may not be provided on the second circuit board FCB. In this case, the driving chip F-IC may be provided on the non-bending region NBA or on the facing region FA shown in FIG. 3C of the display panel DP.

As shown in FIG. 8C, the driving chip F-IC may be disposed on the rear surface of the second circuit board FCB, not on the front surface of the second circuit board FCB as shown in FIGS. 4A and 8A. In FIG. 8C, the driving chip F-IC is depicted by a dotted line to indicate that the driving chip F-IC is disposed on the rear surface of the second circuit board FCB.

Figure 9A:
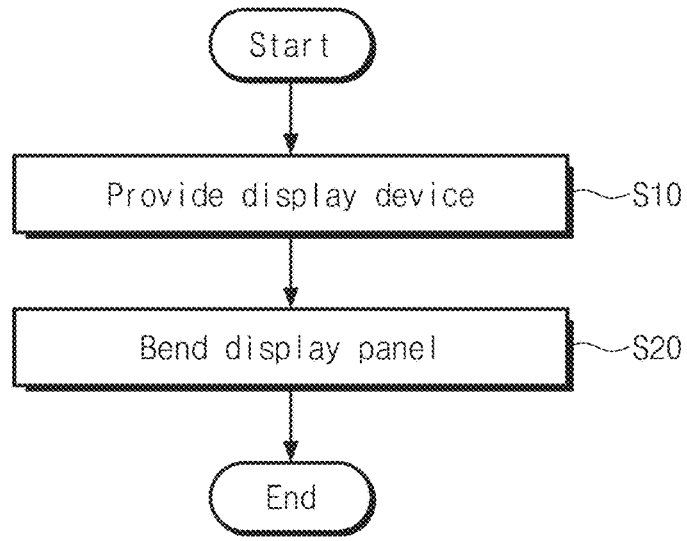
FIGS. 9A and 9B are flow charts illustrating a method of fabricating a display device according to some embodiments of the inventive concept.
Figure 9B:
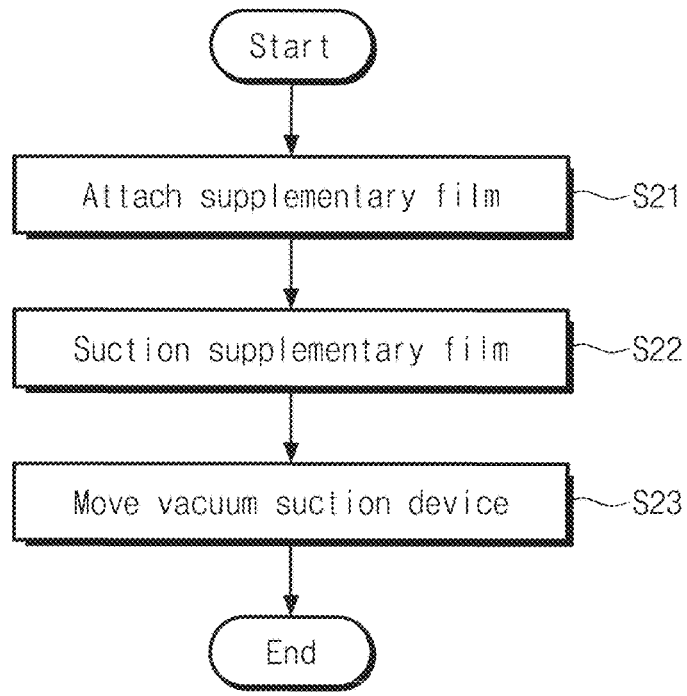
Figure 10A:
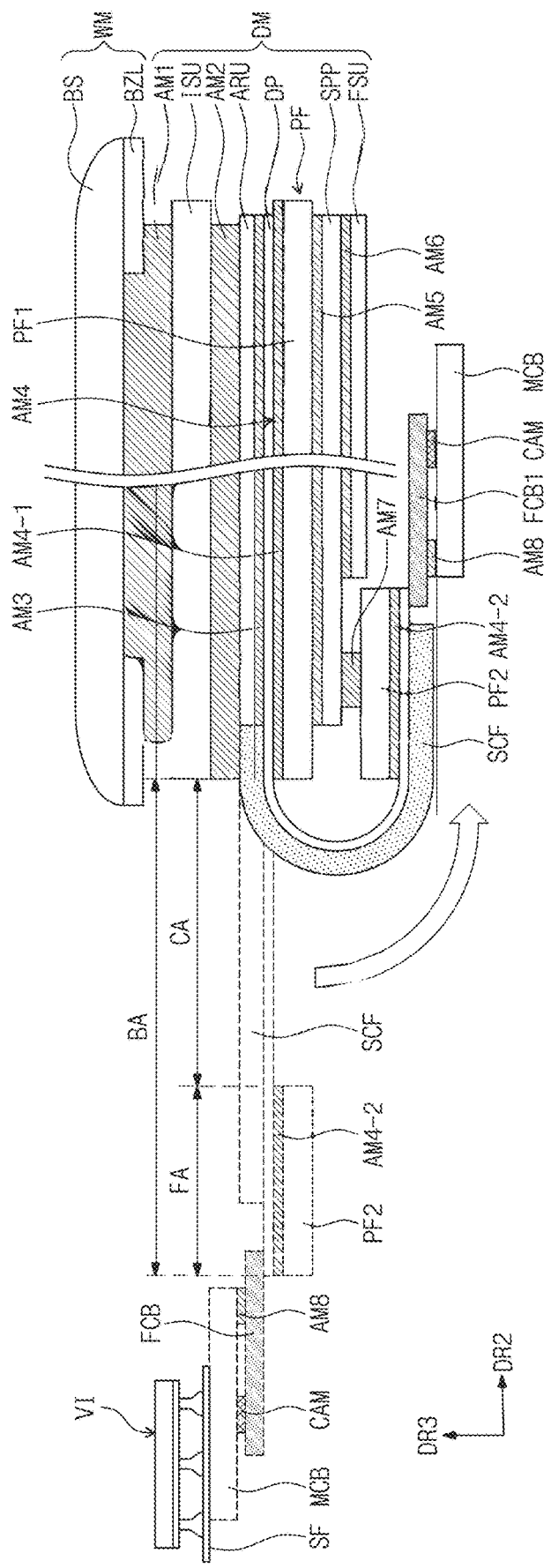
FIG. 10A is a side view illustrating a step of a method of fabricating a display device according to some embodiments of the inventive concept.
Figure 10B:
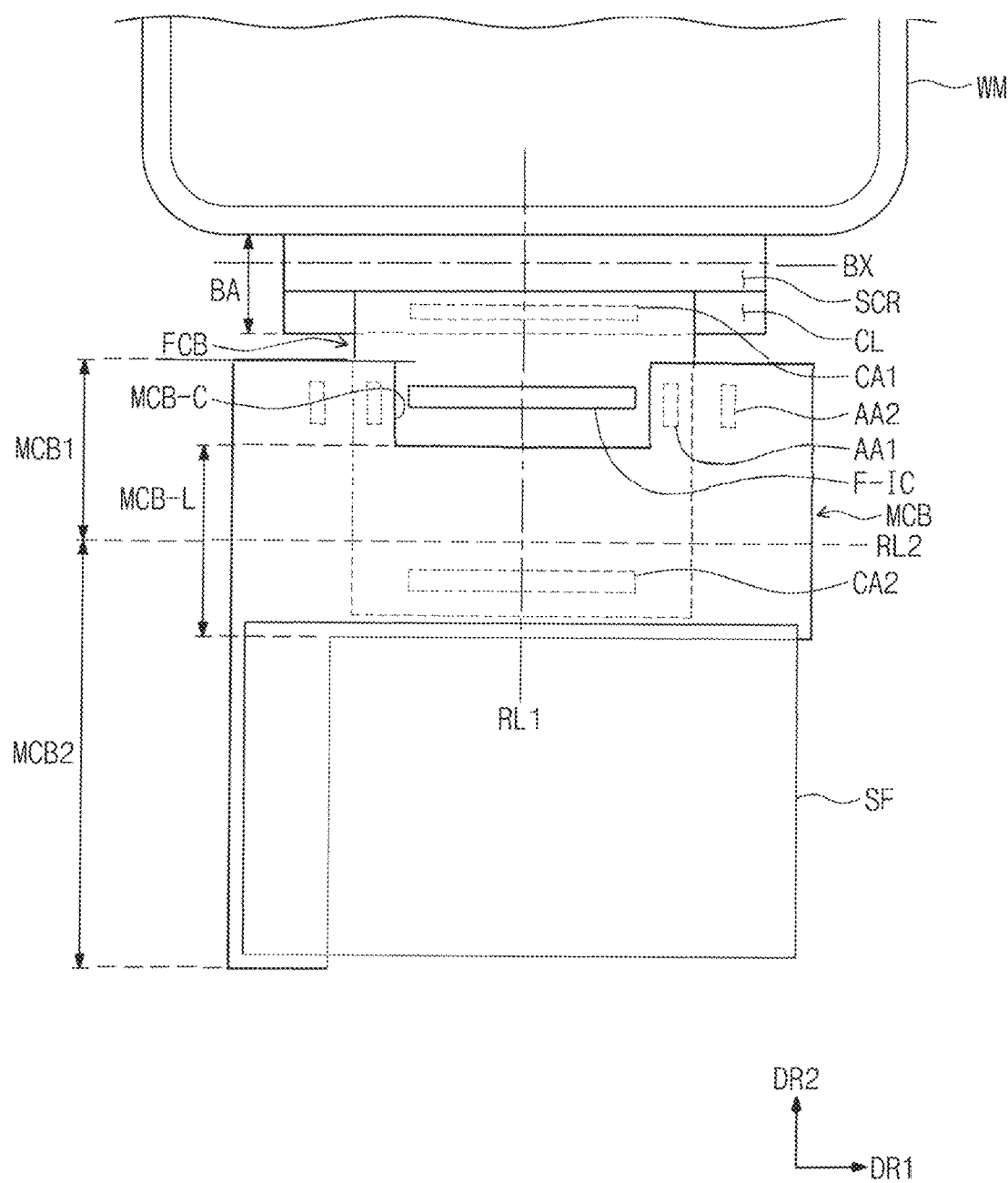
FIG. 10B is a plan view illustrating a step of a method of fabricating a display device according to some embodiments of the inventive concept.
Figure 11A:
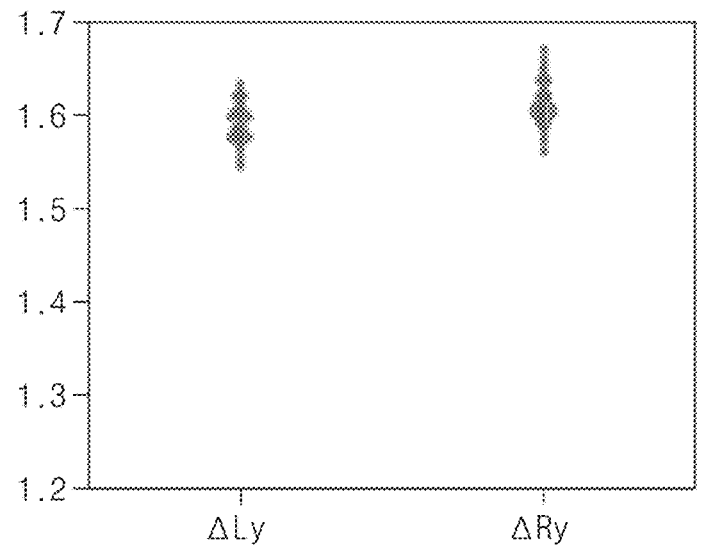
FIGS. 11A and 11B are graphs showing failure rates of display devices that are fabricated by methods according to some embodiments of the inventive concept and according to a comparative example.
Figure 11B:
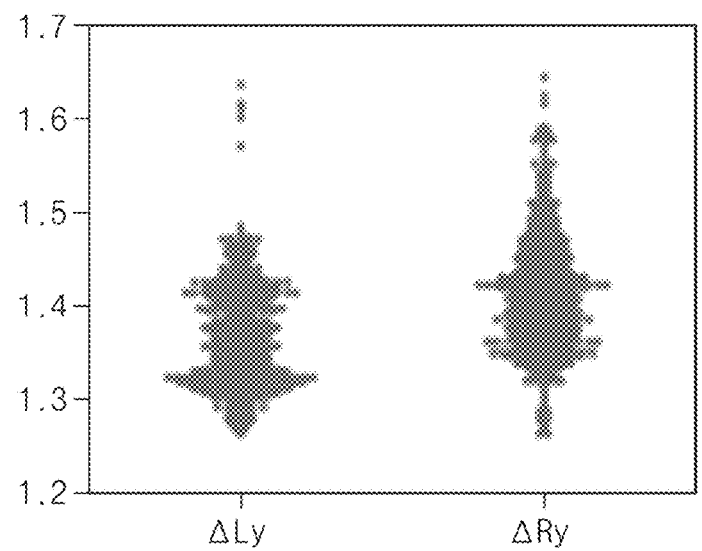

FIGS. 9A and 9B are flow charts illustrating a method of fabricating the display device DD according to some embodiments of the inventive concept. FIG. 10A is a side view illustrating a step of a method of fabricating the display device DD according to some embodiments of the inventive concept. FIG. 10B is a plan view illustrating a step of a method of fabricating the display device DD according to some embodiments of the inventive concept. FIGS. 11A and 11B are graphs showing failure rates of the display device DD that are fabricated by methods according to some embodiments of the inventive concept and according to a comparative example.

Firstly, as shown in FIG. 9A, the display device DD may be provided (in S10). Here, the display device DD may refer to the display device DD an unfolded state as shown in FIG. 3B. The display panel DP may include a first region that is combined with the window member WM, and a second region that is not combined with the window member WM. The first region may not be overlapped with the second adhesive element AM2, and the second region may correspond to the bending region BA shown in FIG. 3B.

The first circuit board MCB and the second circuit board FCB may be combined with each other by the conductive element CAM and the eighth adhesive element AM8. When viewed in the second direction DR2, the conductive element CAM may be disposed farther away from the display panel DP than the eighth adhesive element AM8.

Next, the second region (i.e., the bending region BA) of the display panel DP may be bent to allow the first circuit board MCB and the second circuit board FCB to face the rear surface of the display panel DP (in S20). As described with reference to FIGS. 4A to 4F, since the plurality of the first adhesion regions AA1 arranged symmetrically are bent along the bending region BA to have a uniform curvature radius in the direction of the bending axis BX, the second circuit board FCB may be prevented from being twisted or distorted during the bending process. Accordingly, the display panel DP may be bent within a desired range of dimensional tolerance.

Referring to FIGS. 11A and 11B, a failure rate of a method of fabricating the display device DD according to some embodiments of the inventive concept was lower than that according to the comparative example. In FIGS. 11A and 11B, the x axis represents a first length $\Delta Ly$ and a second length $\Delta Ry$ shown in FIG. 4D. Referring to FIG. 4D, the first length $\Delta Ly$ represents a left length of the stress control film SCF in the bent state, and the second length $\Delta Ry$ represents a right length of the stress control film SCF in the bent state.

As in some embodiments of the inventive concept, the first adhesion regions AA1 are symmetrically provided in the display device DD. As a result, the first length $\Delta Ly$ and the second length $\Delta Ry$ may have a small deviation as is illustrated in FIG. 11A.

As in the comparative examples, the first adhesion regions AA1 are provided asymmetrically in the display device or the first adhesion regions are not provided. As a result, the first length $\Delta Ly$ and the second length $\Delta Ry$ may have a large deviation as is illustrated in FIG. 11B. As described with reference to FIG. 4G, is the failure rate of the comparative example is higher because the second circuit board FCB is twisted or distorted during the bending process.

In some embodiments, the seventh adhesive element AM7 may be attached to the support panel SPP or the ninth adhesive element AM9 (e.g., see FIG. 7A) may be attached to the force sensing unit FSU, before the bending of the bending region BA. The seventh adhesive element AM7 and the ninth adhesive element AM9 may be successively or simultaneously attached to their corresponding components, respectively. The seventh adhesive element AM7 and the ninth adhesive element AM9 may have thicknesses different from each other. The tenth adhesive element AM10 (e.g., see FIG. 7B) described with reference to FIG. 7B may also be attached to the support panel SPP or the force sensing unit FSU.

In some embodiments, the bending of the bending region BA may be performed by attaching the seventh adhesive element AM7 to the protection film PF, attaching the ninth adhesive element AM9 to the first circuit board MCB, or attaching the tenth adhesive element AM10 to the second circuit board FCB. In other words, the bending of the bending region BA may be performed, when at least one of the seventh adhesive element AM7, the ninth adhesive element AM9, and the tenth adhesive element AM10 is attached to a corresponding component.

A process of bending the bending region BA will be described in detail with reference to FIGS. 9B to 10B. Firstly, as shown in FIGS. 10A and 10B, a supplementary film SF may be attached to the first circuit board MCB (in S21). The supplementary film SF may include a plastic film that is similar to the protection film PF. The supplementary film SF may be attached to a top edge region of the first circuit board MCB. An adhesive element (e.g., a PSA, OCA, or OCR film) may be disposed in an adhesion region between the supplementary film SF and the first circuit board MCB.

Next, the supplementary film SF may be suctioned by a vacuum suction device VI (in S22). Since the supplementary film SF provides a suction region, it may be possible to prevent the first circuit board MCB from being damaged in a suction process. The supplementary film SF may compensate an asymmetric shape of the first circuit board MCB and may provide a large suction area.

Next, the vacuum suction device VI may be moved while bending the bending region BA until the bending region BA is bent at a specific curvature (in S23). The bending region BA may be bent to allow the second protection film PF2 to be in contact with the seventh adhesive element AM7 and allow the first circuit board MCB to be in contact with the ninth adhesive element AM9. When the bending region BA is bent, the second circuit board FCB may also be in contact with the tenth adhesive element AM10.

Although not shown, the vacuum suction device VI may be detached from the supplementary film SF after the bending process. In addition, the supplementary film SF may also be detached from the first circuit board MCB.

The display device DD fabricated through the present method may be used to fabricate the electronic device ED (e.g., see FIGS. 1A and 1B). For example, the display device DD may be combined with another component of the electronic device ED. An example of such component of the electronic device ED is a connector of a motherboard that is electrically connected to the first circuit board MCB of the display device DD. In another example, the component of the electronic device ED may include the bracket BRK or the external case EDC that is physically combined with the display device DD.

According to some embodiments of the inventive concept, a first circuit board and a second circuit board may be provided to have a relatively large overlapping area, and it allows to place another electronic module in a space, in which the first and second circuit boards of a display device are not overlapped with each other. In other words, a space of an electronic device is effectively used.

According to some embodiments, a driving chip mounted on the second circuit board is placed in a cut region of the first circuit board to more effectively use the space of the electronic device.

The first and second circuit boards may be combined with each other by a first adhesive element to reduce a stress exerted on a coupling region between the first circuit board and the second circuit board during a process of bending a display panel.

First adhesion regions at both sides of the second circuit board may be provided to be symmetric with respect to a first reference line, and thus, a stress may be uniformly exerted on a bending region of the display panel during the process of bending the display panel. Accordingly, the bending region may be bent along a bending axis to have a uniform curvature radius.

The display panel may be bent using a supplementary film that is temporarily attached to the first circuit board to prevent the first circuit board from being damaged. In addition, even if the first circuit board has an asymmetric shape, the asymmetric shape of the first circuit board may be temporarily compensated by using the supplementary film to uniformly exert a stress on the first circuit board and the bending region of the display panel.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a display device, comprising:
providing a display device comprising a window member, a display panel including a first region combined with the window member and a second region uncombined with the window member, a flexible circuit board combined with the second region of the display panel, a driving circuit board combined with the flexible circuit board, a first adhesive element that is disposed between the flexible circuit board and the driving circuit board in a thickness direction of the display panel to combine the flexible circuit board with the driving circuit board, and a conductive element that is disposed between the flexible circuit board and the driving circuit board in the thickness direction of the display panel to electrically connect the driving circuit board to the flexible circuit board, the conductive element being disposed farther away from the display panel than the first adhesive element; and
bending the second region of the display panel to place the flexible circuit board and the driving circuit board to face a rear surface of the display panel.

2. The method of claim 1, wherein the bending of the second region of the display panel comprises:
attaching a supplementary film to the driving circuit board;
suctioning the supplementary film using a vacuum suction device; and
moving the vacuum suction device to bend the second region at a specific curvature.

3. The method of claim 1, further comprising attaching adhesive elements to a rear surface of an underlying element that is disposed on the rear surface of the display panel prior to bending the second region of the display panel.

4. The method of claim 3, wherein at least one of the adhesive elements is used to combine the underlying element with the driving circuit board.

5. The method of claim 3, wherein at least one of the adhesive elements is used to combine the underlying element with the flexible circuit board.

6. The method of claim 3, wherein the second region of the display panel comprises a curvature region and a facing region,
  wherein the bending of the second region of the display panel is performed to bend the curvature region at a specific curvature and to place the facing region to face the first region in a thickness direction of the display panel, and
  wherein at least one of the adhesive elements is used to combine the underlying element with the facing region.

* * * * *